(12) United States Patent
Han

(10) Patent No.: US 11,569,240 B2
(45) Date of Patent: Jan. 31, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/659,062

(22) Filed: Apr. 13, 2022

(65) Prior Publication Data
US 2023/0005923 A1    Jan. 5, 2023

Related U.S. Application Data

(63) Continuation of application No. PCT/CN2021/128087, filed on Nov. 2, 2021.

(30) Foreign Application Priority Data

Jul. 1, 2021 (CN) .......................... 202110746053.8

(51) Int. Cl.
*H01L 27/108* (2006.01)
*H01L 29/423* (2006.01)
(Continued)

(52) U.S. Cl.
CPC .... *H01L 27/10814* (2013.01); *H01L 27/1085* (2013.01); *H01L 27/10885* (2013.01);
(Continued)

(58) Field of Classification Search
CPC ........... H01L 27/10814; H01L 27/1085; H01L 27/10885; H01L 27/10891;
(Continued)

(56) References Cited

U.S. PATENT DOCUMENTS 7,968,876 B2    6/2011 Lung et al.
10,361,206 B2    7/2019 Moon et al.
(Continued)

FOREIGN PATENT DOCUMENTS

CN    101572258 A    11/2009
CN    101908553 A    12/2010
(Continued)

OTHER PUBLICATIONS

International Search Report and English Translation as cited in PCT/CN2021/128087 dated Mar. 28, 2022, 17 pages.
(Continued)

*Primary Examiner* — Tong-Ho Kim
(74) *Attorney, Agent, or Firm* — Cooper Legal Group, LLC

(57) ABSTRACT

The present disclosure provides a semiconductor structure and a manufacturing method thereof. The manufacturing method includes: providing a base; forming bit lines on the base, and forming semiconductor channels on surfaces of the bit lines away from the base, the semiconductor channel including a first doped region, a channel region and a second doped region arranged sequentially; forming a first dielectric layer, the first dielectric layer surrounding sidewalls of the semiconductor channels, and a first gap being provided between parts of the first dielectric layer located on sidewalls of adjacent semiconductor channels on a same bit line; forming a second dielectric layer, the second dielectric layer filling up the first gaps, and a material of the second dielectric layer being different from a material of the first dielectric layer; removing a part of the first dielectric layer to expose sidewalls of the channel regions.

19 Claims, 21 Drawing Sheets

(51) Int. Cl.
*H01L 29/66* (2006.01)
*H01L 29/786* (2006.01)

(52) U.S. Cl.
CPC .. *H01L 27/10891* (2013.01); *H01L 29/42392* (2013.01); *H01L 29/66742* (2013.01); *H01L 29/78696* (2013.01)

(58) Field of Classification Search
CPC ......... H01L 29/42392; H01L 29/66742; H01L 29/78696
USPC .......................................... 257/295
See application file for complete search history.

(56) References Cited

U.S. PATENT DOCUMENTS

| | | | |
|---|---|---|---|
| 10,629,615 | B1 | 4/2020 | Hu et al. |
| 2006/0113587 | A1 | 6/2006 | Thies et al. |
| 2007/0051994 | A1 | 3/2007 | Song et al. |
| 2009/0273088 | A1 | 11/2009 | Chung et al. |
| 2012/0064704 | A1 | 3/2012 | Kim |
| 2012/0080725 | A1 | 4/2012 | Manos et al. |
| 2012/0119286 | A1 | 5/2012 | Kim et al. |
| 2013/0161710 | A1 | 6/2013 | Ji et al. |
| 2013/0323920 | A1 | 12/2013 | Chang et al. |
| 2019/0074363 | A1 | 3/2019 | Zhu |
| 2019/0157345 | A1* | 5/2019 | Zhu ...................... H01L 27/222 |
| 2020/0258895 | A1 | 8/2020 | Xiao et al. |
| 2021/0028174 | A1 | 1/2021 | Lee |
| 2021/0066319 | A1 | 3/2021 | Chang et al. |

FOREIGN PATENT DOCUMENTS

| | | | |
|---|---|---|---|
| CN | 102543847 | A | 7/2012 |
| CN | 103311249 | A | 9/2013 |
| CN | 108461496 | A | 8/2018 |
| CN | 108493188 | A | 9/2018 |
| CN | 208127209 | U | 11/2018 |
| CN | 109461738 | A | 3/2019 |
| CN | 208655642 | U | 3/2019 |
| CN | 110957319 | A | 4/2020 |
| CN | 111354738 | A | 6/2020 |
| CN | 111415945 | A | 7/2020 |
| CN | 211719592 | U | 10/2020 |
| CN | 112447734 | A | 3/2021 |
| KR | 20090132298 | A | 12/2009 |

OTHER PUBLICATIONS

International Search Report cited in PCT/CN2021/117284 dated Mar. 29, 2022, 9 pages.
International Search Report cited in PCT/CN2021/121617 dated Mar. 3, 2022, 8 pages.
International Search Report and Written Opinion cited in PCT/CN2022/076372 dated Apr. 28, 2022, 8 pages.

* cited by examiner

US 11,569,240 B2

SEMICONDUCTOR STRUCTURE AND MANUFACTURING METHOD THEREOF

CROSS-REFERENCE TO RELATED APPLICATIONS

This is a continuation of International Application No. PCT/CN2021/128087, filed on Nov. 2, 2021, which claims the priority to Chinese Patent Application 202110746053.8, titled "SEMICONDUCTOR STRUCTURE AND MANUFACTURING METHOD THEREOF" and filed on Jul. 1, 2021. The entire contents of International Application No. PCT/CN2021/128087 and Chinese Patent Application 202110746053.8 are incorporated herein by reference.

TECHNICAL FIELD

The present disclosure relates to, but is not limited to, a semiconductor structure and a manufacturing method thereof.

BACKGROUND

With the increasingly high integration density of the semiconductor device, those skilled in the related art start studying how transistors are arranged in semiconductor structures and how to reduce the sizes of individual functional devices in semiconductor structures.

In the related art, memory cells of a dynamic random access memory (DRAM) based on a saddle-fin transistor occupy an area of 6F2 (F: the minimum pattern size available under a specific process condition). To further reduce the occupied area of the DRAM, when the DRAM is scaled proportionally, a problem such as the proximity gate effect occurs, which will adversely affect the electrical performance of the DRAM. If vertical gate-all-around (GAA) transistors are used as access transistors, the area occupied by the GAA transistors can reach 4F2. In principle, higher density efficiency can be achieved, but there are problems such as difficulty in word line etching within some size ranges due to the limitations of the equipment used in the manufacturing process and the manufacturing process.

SUMMARY

An overview of the subject matter detailed in the present disclosure is provided below, which is not intended to limit the protection scope of the claims.

According to a first aspect of the embodiments of the present disclosure, a method of manufacturing a semiconductor structure is provided and includes: providing a base; forming bit lines on the base, and forming semiconductor channels on surfaces of the bit lines away from the base, the semiconductor channel including a first doped region, a channel region and a second doped region sequentially arranged along a direction that the base points to the bit line; forming a first dielectric layer, the first dielectric layer surrounding sidewalls of the semiconductor channels; and a first gap being provided between parts of the first dielectric layer located on sidewalls of adjacent semiconductor channels on a same bit line; forming a second dielectric layer, the second dielectric layer filling up the first gaps; and a material of the second dielectric layer being different from a material of the first dielectric layer; removing a part of the first dielectric layer to expose sidewalls of the channel regions; forming an insulating layer, the insulating layer covering at least sidewall surfaces of the channel regions; and second gaps being provided between the insulating layer and the second dielectric layer; and forming word lines, the word lines filling up the second gaps.

According to a second aspect of the embodiments of the present disclosure, a semiconductor structure is provided and includes: a base; bit lines, located on the base; semiconductor channels, located on surfaces of the bit lines, the semiconductor channel including a first doped region, a channel region and a second doped region sequentially arranged along a direction that the base points to the bit line; and the first doped region being in contact with the bit line; a first dielectric layer, surrounding the first doped regions, and a first gap being provided between parts of the first dielectric layer covering sidewalls of adjacent first doped regions on a same bit line; an insulating layer, covering at least sidewall surfaces of the channel regions; word lines, surrounding the insulating layer located on sidewalls of the channel regions, and a second gap being provided between adjacent word lines; and an isolation layer, located at least in the first gaps and the second gaps, and a top surface of the isolation layer away from the base being not lower than a top surface of the second doped region away from the base.

Other aspects of the present disclosure are understandable upon reading and understanding of the drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other accompanying drawings based on these accompanying drawings without creative efforts.

DETAILED DESCRIPTION

Figure 1:
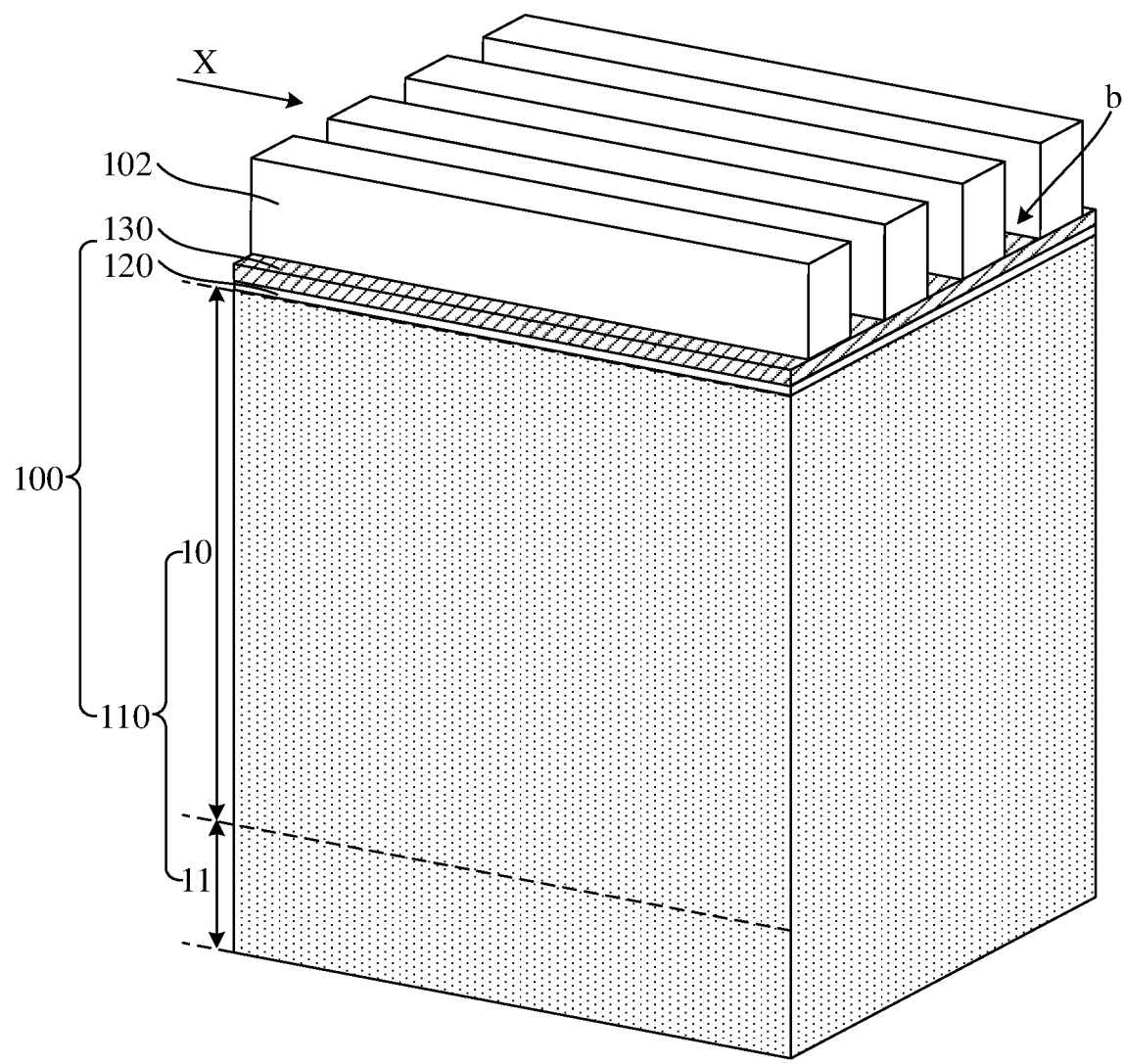
FIGS. 1 to 25 are schematic structural diagrams corresponding to steps of a method of manufacturing a semiconductor structure according to an embodiment of the present disclosure.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It is found through analyses that when word lines surrounding the sidewalls of the channel regions of the semiconductor channels in the GAA transistor are formed, deposition and etching processes are usually required to form a plurality of discrete word lines. However, due to the relatively high integration and the relatively small gap between adjacent semiconductor channels, the etching precision is difficult to control when the word lines are formed through the etching process, and thus the dimensional precision for forming the word lines is also difficult to control. In addition, when the size of the GAA transistor is relatively small, it is difficult to control the doping concentration of each region of the semiconductor channel to form a GAA junction transistor with a vertical structure, which affects the yield of the PN junction formed finally.

The embodiments of the present disclosure provide a semiconductor structure and a manufacturing method thereof. In the manufacturing method, a part of the first dielectric layer occupies the positions of the insulating layer and word lines to be formed subsequently. After the second dielectric layer is formed, when a part of the first dielectric layer on the sidewalls of the channel regions is removed, the remaining part of the first dielectric layer is located on the sidewalls of the first doped regions, such that when the insulating layer is formed on the sidewalls of the channel regions, the remaining part of the first dielectric layer can protect the first doped regions from impacts. In addition, second gaps are formed between the insulating layer and the second dielectric layer. Word lines with a highly accurate size can be formed in the second gaps in a self-aligned manner, without the etching process, which is beneficial to simplify the forming the word lines. Moreover, adjusting the size of the second gaps can obtain word lines with a small size. In addition, the doping concentrations of the doped ion in the first doped region, the channel region, and the second doped region may be the same, such that the device formed in a semiconductor channel 105 is junctionless transistor.

An embodiment of the present disclosure provides a method of manufacturing a semiconductor structure. The method of manufacturing a semiconductor structure provided by the embodiment of the present disclosure is described in detail below with reference to the accompanying drawings. FIGS. 1 to 25 are schematic structural diagrams corresponding to steps of the method of manufacturing a semiconductor structure according to an embodiment of the present disclosure. It should be noted that to conveniently describe and clearly illustrate the steps of the method of manufacturing a semiconductor structure, FIGS. 1 to 25 in this embodiment are all schematic partial-structural diagrams of the semiconductor structure.

With reference to FIG. 1, a base 100 is provided. In this embodiment, the base 100 includes: a substrate 110 and a buffer layer 120 and a protective layer 130 that are stacked sequentially on the substrate 110.

In this embodiment, the providing the base 100 includes:

The substrate 110 is provided and may be made of an elemental semiconductor material or a crystalline inorganic compound semiconductor material. The elemental semiconductor material may include silicon or germanium, and the crystalline inorganic compound semiconductor material may include silicon carbide, silicon germanium, gallium arsenide, indium gallium arsenide or the like.

The substrate 110 includes: a semiconductor well layer 11, wherein the semiconductor well layer 11 is doped with a first type of ion; and an initial semiconductor layer 10 provided on the semiconductor well layer 11.

The initial semiconductor layer 10 is doped and annealed such that the initial semiconductor layer 10 is doped with a second type of ion, which are used to subsequently form the bit lines and semiconductor channels based on the initial semiconductor layer 10. The second type of ion is different from the first type of ion, and the first type of ion and the second type of ion are respectively one of N-type ion or P-type ion. The N-type ion is at least one of arsenic ion, phosphorous ion or antimony ion, and the P-type ion is at least one of boron ion, indium ion or gallium ion.

The doping treatment may be performed through high-temperature diffusion or ion implantation. When the initial semiconductor layer 10 is doped through ion implantation, annealing is performed at 800-1,000° C.

In this embodiment, the doping concentration of the second type of ion in the initial semiconductor layer 10 is $1 \times 10^{19}$ atom/cm3 to $1 \times 10^{20}$ atom/cm3. In a direction of from the initial semiconductor layer 10 to the semiconductor well layer 11, the doping depth of the second type of ion in the initial semiconductor layer 10 is 150-250 nm. The first type of ion is P-type ion, and the second type of ion is N-type ion. In other embodiments, the first type of ion may be N-type ion, and the second type of ion may be P-type ion.

The buffer layer 120 and the protective layer 130 are sequentially stacked on a side of the initial semiconductor layer 10 away from the semiconductor well layer 11. In some examples, the buffer layer 120 and the protective layer 130 may be formed through a deposition process. The buffer layer 120 is made of silicon oxide, and the protective layer 130 is made of silicon nitride.

Silicon nitride may be deposited though a chemical vapor deposition process to form the protective layer 130. The silicon nitride film layer is quite slow to oxidize, which can protect the substrate 110 located under the silicon nitride film layer and prevent the substrate 110 from being oxidized.

In some examples, the substrate 110 is a silicon substrate. The lattice constant and thermal expansion coefficient of silicon nitride have a large mismatch with those of the silicon substrate. If silicon nitride is deposited directly on the silicon substrate, due to the high defect density, the interface between silicon nitride and silicon is likely to become a carrier trap or recombination center. This affects the carrier mobility of silicon, thereby affecting the performance and operation life of the semiconductor structure. Due to the relatively high stress of the silicon nitride film, it is prone to cracking when directly deposited on the silicon substrate. Silicon oxide is deposited as the buffer layer 120 before the silicon nitride is deposited on the silicon substrate, thereby improving the performance and operation life of the semiconductor structure.

With reference to FIG. 1 to FIG. 4, bit lines 104 are formed on the base 100, and semiconductor channels 105 are formed on the surfaces of the bit lines 104 away from the base 100. The semiconductor channel 105 includes a first doped region I, a channel region II, and a second doped region III arranged sequentially along a direction Z that the base 100 points to the bit line 104.

In this embodiment, the forming the bit lines 104 and the semiconductor channels 105 includes:

With reference to FIG. 1, a first mask layer 102 is formed on the base 100, and the first mask layer 102 includes a plurality of first openings b separated from each other. The length of the first opening b along an extension direction X of the first opening b is the same as that of the bit line formed subsequently.

Figure 2:
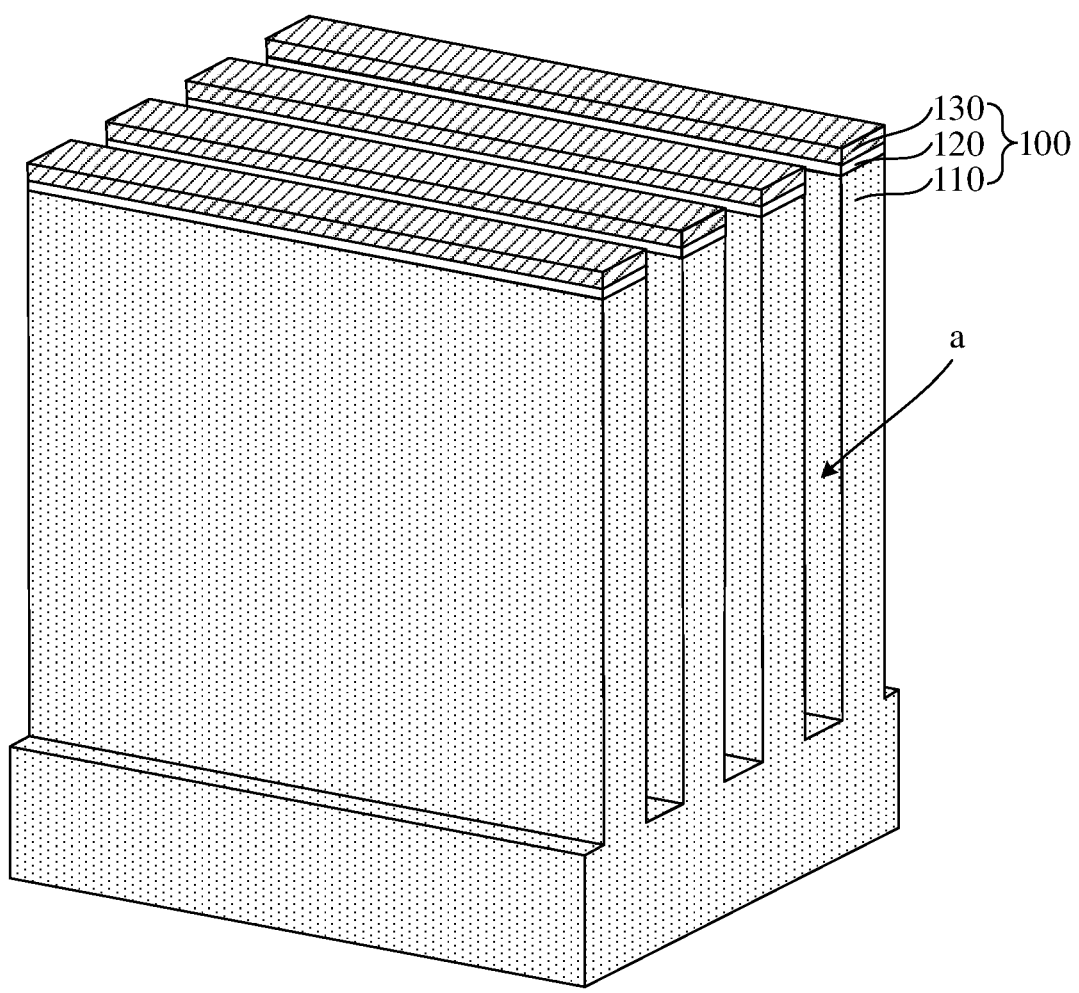

With reference to FIG. 2, the base 100 is etched by using the first mask layer 102 as a mask to form a plurality of first trenches a, and the first mask layer 102 is removed.

In this embodiment, the depth of the first trench a along a direction Z perpendicular to a surface of the base 100 is 250-300 nm. The depth of the first trench a is greater than that of the second type of ion doped in the initial semiconductor layer 10. Therefore, the initial semiconductor layer 10 doped with the second type of ion can be etched to facilitate the subsequent formation of semiconductor channels and bit lines that are doped with the second type of ion of a high doping concentration.

Figure 3:
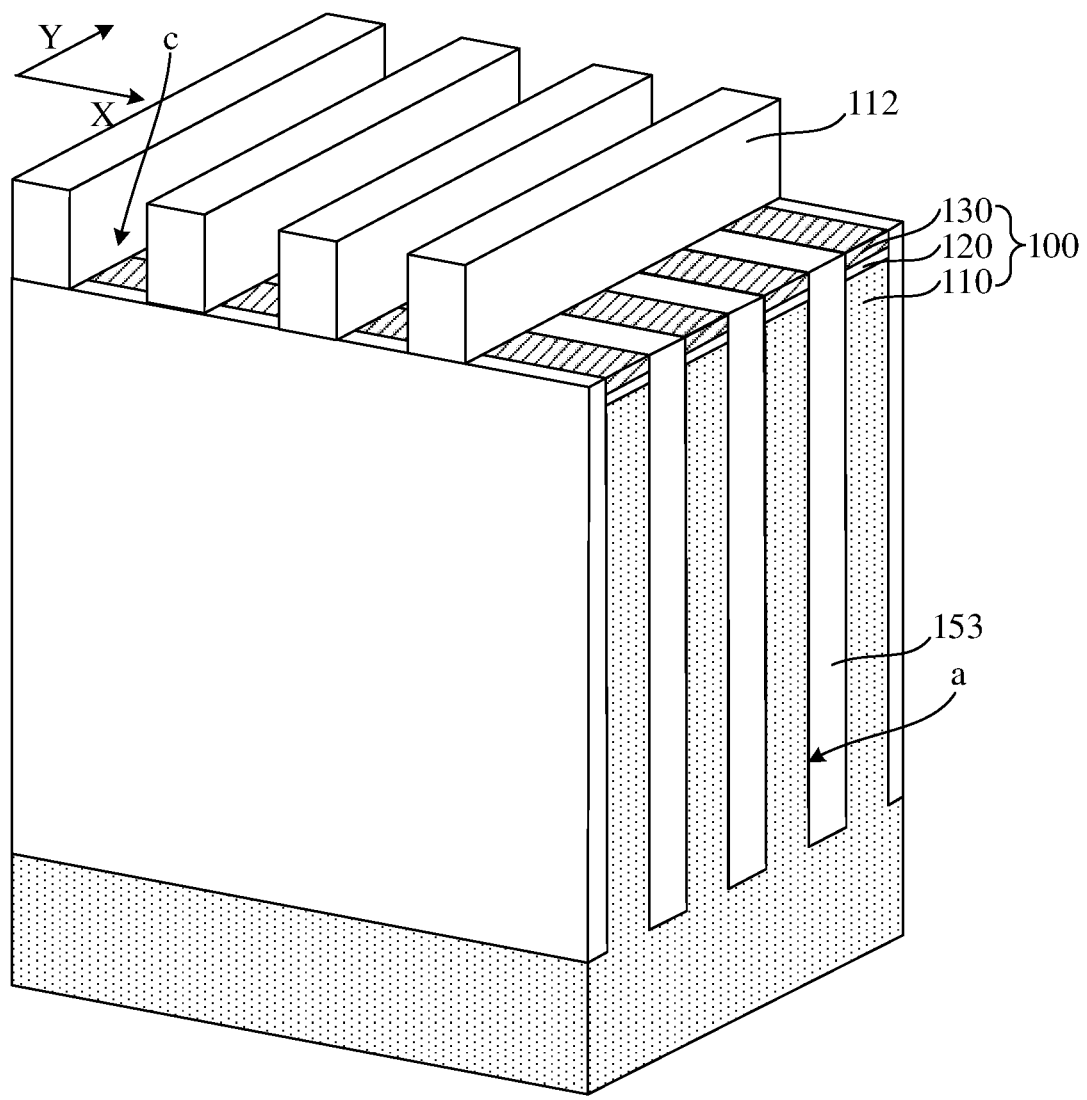

With reference to FIG. 3, a fifth dielectric layer 153 is formed in the first trenches a.

In this embodiment, the fifth dielectric layer 153 may be formed as: a fifth dielectric film that covers a top surface of the protective layer 130 and is used for filling is formed through a deposition process; and a chemical-mechanical planarization process is performed on the fifth dielectric film until the top surface of the protective layer 130 is exposed, wherein the remaining part of the fifth dielectric film forms the fifth dielectric layer 153. The fifth dielectric film includes silicon oxide.

A second mask layer 112 is formed on a top surface formed by the fifth dielectric layer 153 and the remaining part of the base 100, and the second mask layer 112 includes a plurality of second openings c separated from each other. The length of the second opening c along an extension direction Y of the second opening c is the same as that of the word line formed subsequently.

In this embodiment, with reference to FIG. 1 and FIG. 3, the extension direction X of the first opening b is perpendicular to the extension direction Y of the second opening c. Thus, the semiconductor channels formed subsequently present a 4F2 arrangement, which further improves the integration density of the semiconductor structure. In other embodiments, the extension direction of the first opening and the extension direction of the second opening intersect to form an angle that may not be 90°.

A ratio of the width of the first opening b in the direction Y to that of the second opening c in the direction X is 2 to 1, to ensure that a through hole exposing a part of a first dielectric layer surrounding a sidewall of the channel region II can be formed subsequently, which facilitates the subsequent formation of a second gap used for manufacturing the word line. In some examples, the width of the first opening b in the direction Y is equal to that of the second opening c in the direction X, and the spacing between adjacent first openings b is equal to that between adjacent second openings c. In this way, a plurality of semiconductor channels formed subsequently are arranged regularly, which further improves the integration density of the semiconductor structure. In addition, the first mask layer 102 and the second mask layer 112 can be formed by using the same mask, reducing the fabrication costs of the semiconductor structure.

In this embodiment, both the first mask layer 102 and the second mask layer 112 may be formed through a self-aligned quadruple patterning (SAQP) process or a self-aligned double patterning (SADP) process.

Figure 4:
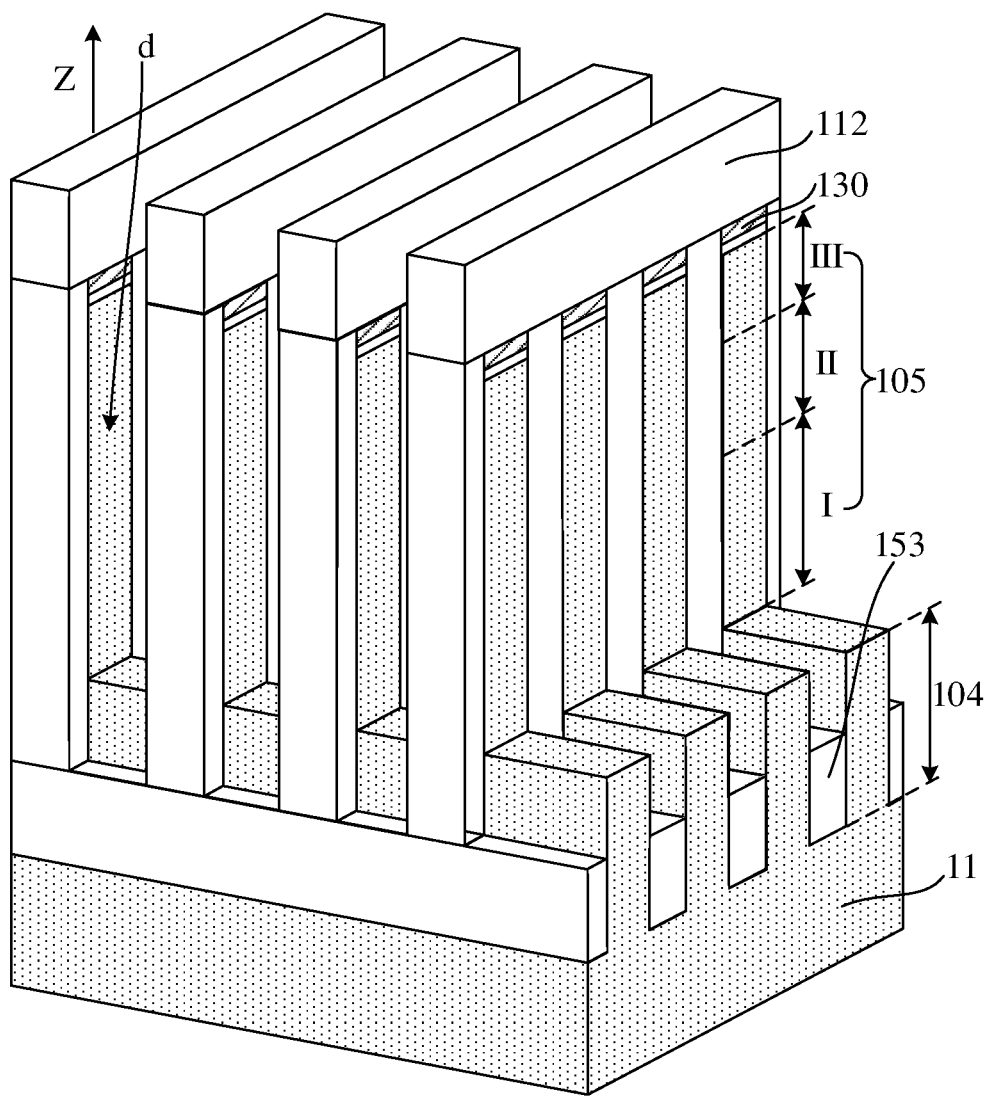

With reference to FIG. 4, the base 100 (refer to FIG. 1) and the fifth dielectric layer 153 are etched by using the second mask layer 112 as a mask to form a plurality of second trenches d, the bit lines 104 and the semiconductor channels 105. In the direction Z perpendicular to the surface of the base 100, the depth of the second trench d is less than that of the first trench a. Thus, when the bit lines 104 are formed, the plurality of semiconductor channels 105 separated from each other are formed on sides of the bit lines 104 away from the semiconductor well layer 11, and the bit line 104 is in contact with the first doped region I of the semiconductor channel 105. The second mask layer 112 is removed.

In some examples, the depth of the second trench d is 100 to 150 nm. Because the depth of the second type of ion doped in the initial semiconductor layer 10 (refer to FIG. 1) is 150 to 250 nm, most or all of the initial semiconductor layer 10 doped with the second type of ion is converted into the semiconductor channels 105 after two etchings.

The substrate 110 is made of silicon, and the fifth dielectric layer 153 is made of silicon oxide. When the base 100 and the fifth dielectric layer 153 are etched by using the second mask layer 112 as a mask, the etch rate for the silicon oxide is greater than that for the silicon. Therefore, part of the sidewall of the bit line 104 is exposed.

In this embodiment, a plurality of bit lines 104 separated from each other may be formed on the semiconductor well layer 11, and the bit line 104 may be in contact with at least one of the first doped regions I. FIG. 4 shows four bit lines 104 separated from each other, wherein the bit line 104 is in contact with four first doped regions I. The quantity of the bit lines 104 and the quantity of the first doped regions I in contact with each of the bit lines 104 may be set properly according to actual electrical requirements.

After the base 100 and the fifth dielectric layer 153 are etched by using the second mask layer 112 as a mask, the remaining part of the fifth dielectric layer 153 is further located in the gaps between adjacent bit lines 104 and the gaps between adjacent semiconductor channels 105. In this way, electrical insulation between adjacent initial bit lines 104 and adjacent semiconductor channels 105 is achieved.

In this embodiment, because the initial semiconductor layer 10 (refer to FIG. 1) is doped with the N-type ion, the bit line 104 and the semiconductor channel 105 that are formed may be doped with N-type ion.

The bit line 104 is doped with the N-type ion. The semiconductor well layer 11 is doped with the P-type ion. The bit line 104 and the semiconductor well layer 11 form a PN junction to prevent the bit line 104 from leaking, thereby further improving the electrical performance of the semiconductor structure. In another embodiment, the base may not include the semiconductor well layer, that is, the base is an initial semiconductor layer, and the bit lines are located on the surface of the initial semiconductor layer.

The device formed by the semiconductor channel 105 is a junctionless transistor, that is, the first doped region I, the channel region II and the second doped region III are doped with the same type of doped ion such as the N-type ion. Further, the first doped region I, the channel region II and the second doped region III may be doped with the same type of doped ions. The "junctionless" here refers to no PN junction, that is, there is no PN junction in the transistor formed by the semiconductor channel 105, and the doping concentrations of the doped ion in the first doped region I, the channel region II and the second doped region III are the same. In this way, there is no need to perform additional doping in the first doped region I and the second doped region III, thereby avoiding the problem that the doping process in the first doped region I and the second doped region III is difficult to control. Especially as the size of the transistor is further reduced, if the first doped region I and the second doped region III are additionally doped, the doping concentration becomes more difficult to control. In addition, because the device is a junctionless transistor, it avoids the use of an ultra-steep source/drain doping process to make an ultra-steep PN junction in a nanoscale range. Therefore, problems such as threshold voltage drift and leakage current increase caused by abrupt changes in the doping concentration can be avoided, and the short channel effect can be easily suppressed, such that the device can still operate in the range of a few nanometers. Such a design further improves the integration density and electrical performance of the semiconductor structure. The additional doping herein refers to doping to make the type of the doped ion in the first doped region I and the second doped region III different from that of the doped ion in the channel region II.

The semiconductor channel 105 forms a GAA transistor perpendicular to a top surface of the bit line 104 away from the semiconductor well layer 11, thereby forming a 3D stacked semiconductor structure. The GAA transistors are designed with a small size without adversely affecting the electrical performance of the GAA transistors, which increases the integration density of the semiconductor structure.

In this embodiment, the first mask layer 102 and the second mask layer 112 are used to simultaneously form the bit lines 104 and the semiconductor channels 105 through two etching processes. The size of the semiconductor channel 105 is adjusted by adjusting the sizes of the first opening b and the second opening c, such that the semiconductor channels 105 are formed with high dimensional accuracy. The bit lines 104 and the semiconductor channels 105 are formed by etching the substrate 110. That is, the bit lines 104 and the semiconductor channels 105 are formed by using the same film structure, such that the bit lines 104 and the semiconductor channels 105 are integrated. This avoids the interface state defect between the bit lines 104 and the semiconductor channels 105 and improves the performance of the semiconductor structure. After the base 100 is etched by using the first mask layer 102 as a mask, the fifth dielectric layer 153 is further formed in the first trenches a. This prepares for the subsequent formation of a gap between the sidewall of the channel region II and the second dielectric layer, and facilitates the subsequent formation of the second gap for preparing a word line.

With reference to FIG. 5 to FIG. 8, a first dielectric layer 113 is formed. The first dielectric layer 113 surrounds the sidewalls of the semiconductor channels 105. A first gap e is provided between parts of the first dielectric layer 113 located on the sidewalls of adjacent semiconductor channels 105 on the same bit line 104.

Figure 6:
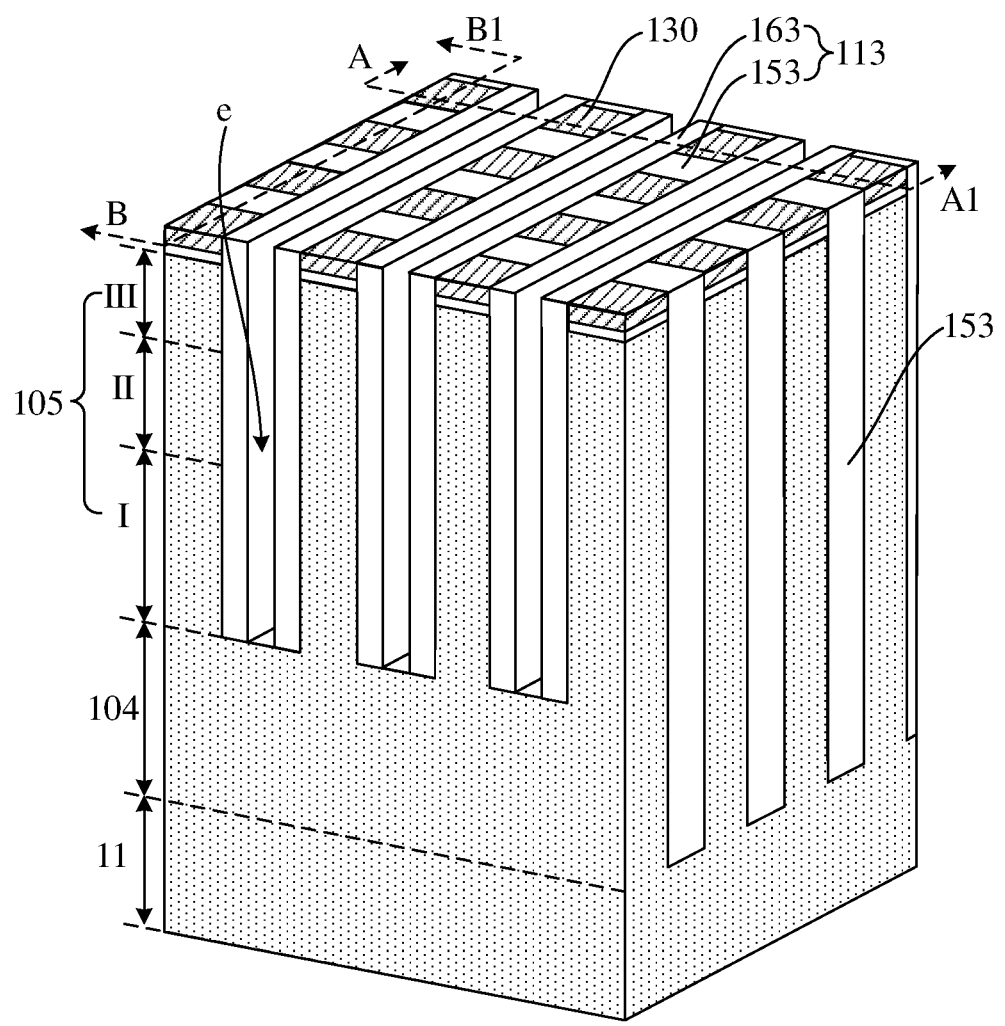
Figure 7:
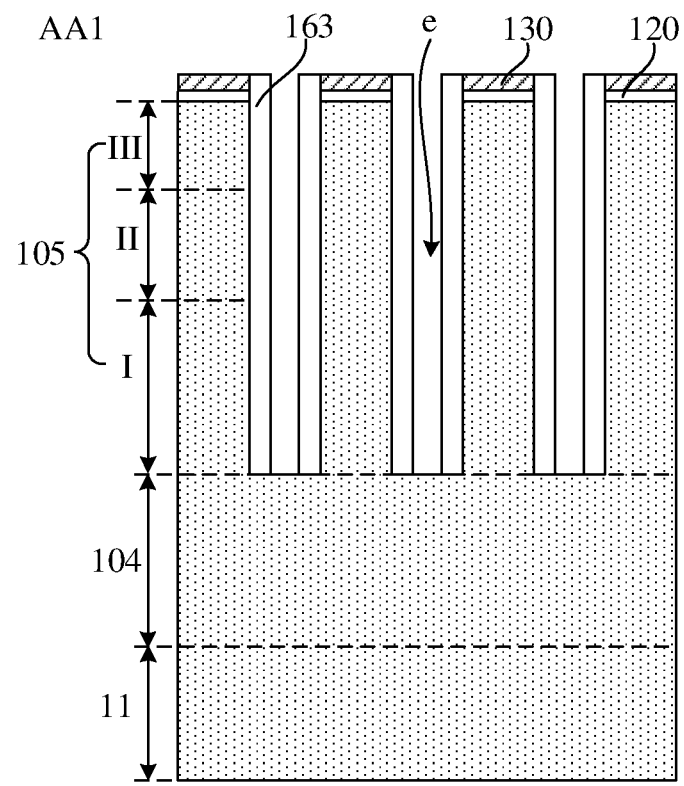
Figure 8:
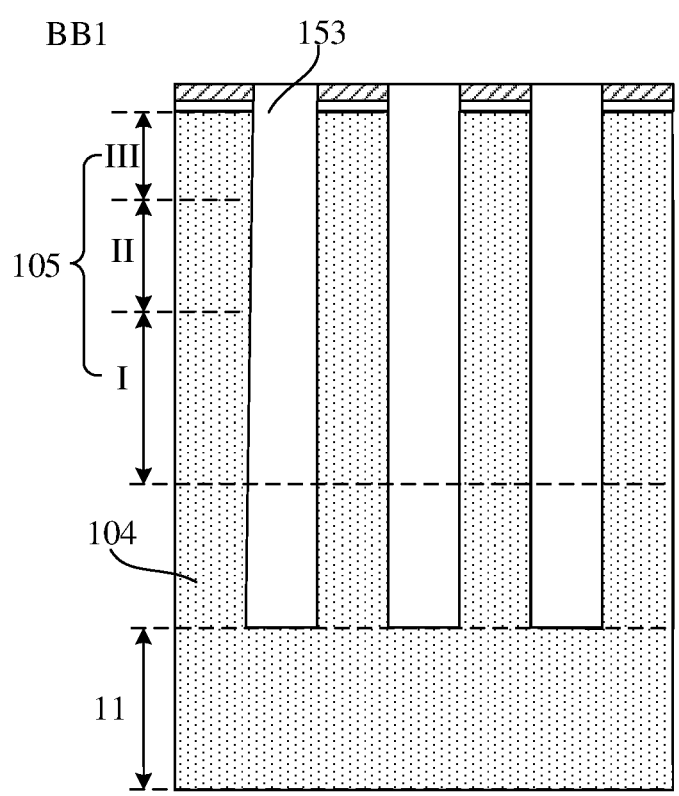

FIG. 7 is a sectional view of the structure shown in FIG. 6 taken along a first sectional direction AA1, and FIG. 8 is a sectional view of the structure shown in FIG. 6 taken along a second sectional direction BB1. It should be noted that one or both of the sectional view along the first sectional direction AA1 or the sectional view along the second sectional direction BB1 are set later according to the requirements of the description. When referring to only one accompanying drawing, the accompanying drawing is the sectional view along the first sectional direction AA1. When referring to two accompanying drawings at the same time, the first accompanying drawing is the sectional view along the first sectional direction AA1, and the second accompanying drawing is the sectional view along the second sectional direction BB1.

Figure 5:
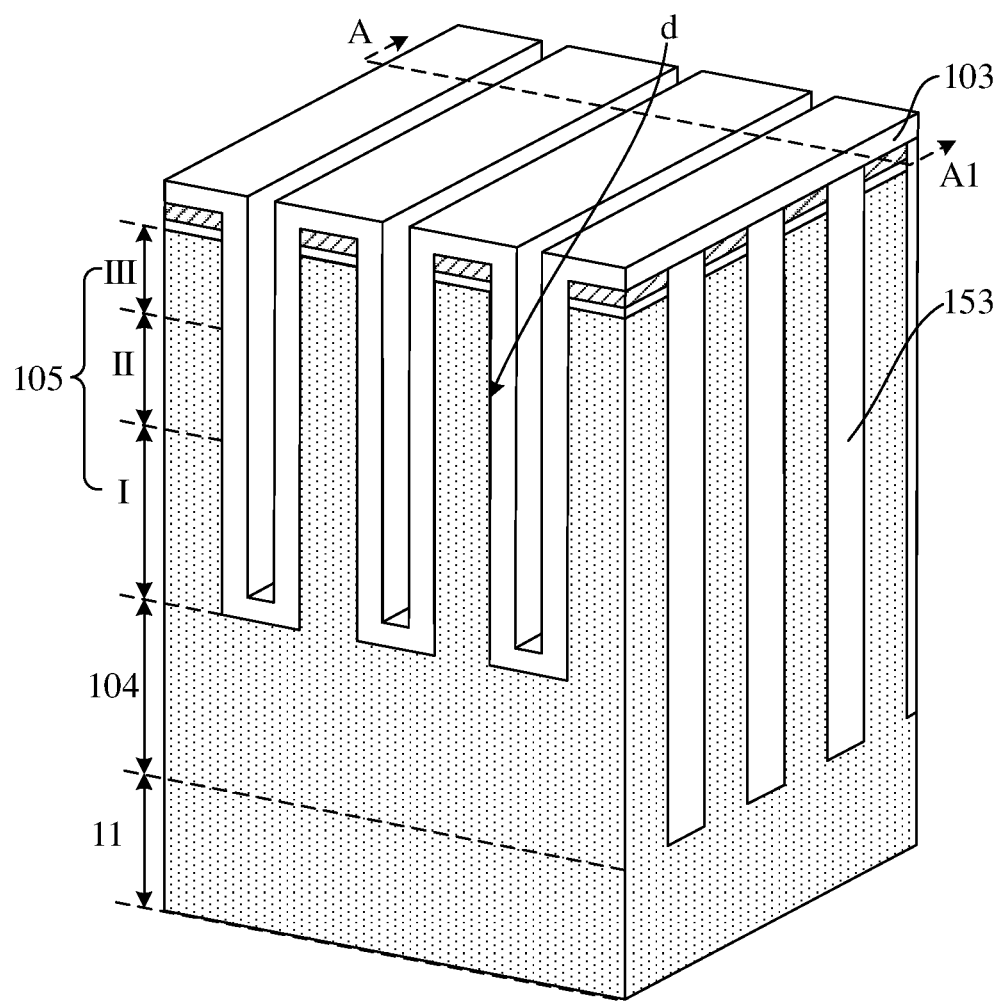

In this embodiment, the forming the first dielectric layer includes:

With reference to FIG. 5, a sixth dielectric film 103 is formed. The sixth dielectric film 103 conformally covers the sidewalls and bottoms of the second trenches d, and is located on top surfaces of the protective layer 130 and the fifth dielectric layer 153.

With reference to FIG. 5 and FIG. 6, the sixth dielectric film 103 is subjected to a maskless dry etching process until the protective layer 130 is exposed. In the same etching time, different regions of the sixth dielectric film 103 are etched to have the same thickness to form the sixth dielectric layer 163.

With reference to FIG. 6 to FIG. 8, the sixth dielectric layer 163 is located on sidewalls of the second trenches d, and the fifth dielectric layer 153 is also located in the gaps between adjacent semiconductor channels 105. The fifth dielectric layer 153 and the sixth dielectric layer 163 form the first dielectric layer 113, and the first gap e is provided between parts of the sixth dielectric layer 163 located on the sidewall of the second trench d.

The sixth dielectric layer 163 and the fifth dielectric layer 153 are made of the same material. Subsequently, a part of the sixth dielectric layer 163 and a part of the fifth dielectric layer 153 corresponding to the sidewalls of the channel regions II are removed together through an etching process, thereby forming gaps between the sidewalls of the channel regions II and a second dielectric layer formed subsequently. This facilitates subsequent formation of the second gaps for preparing word lines. The sixth dielectric layer 163 and the fifth dielectric layer 153 are both made of silicon oxide.

In other embodiments, the sixth dielectric layer and the fifth dielectric layer may also be made of different materials, provided that the materials of the sixth dielectric layer and the fifth dielectric layer have a desirable insulation effect. In this case, a part of the sixth dielectric layer and a part of the fifth dielectric layer corresponding to the sidewalls of the channel regions II are removed through different steps.

Figure 9:
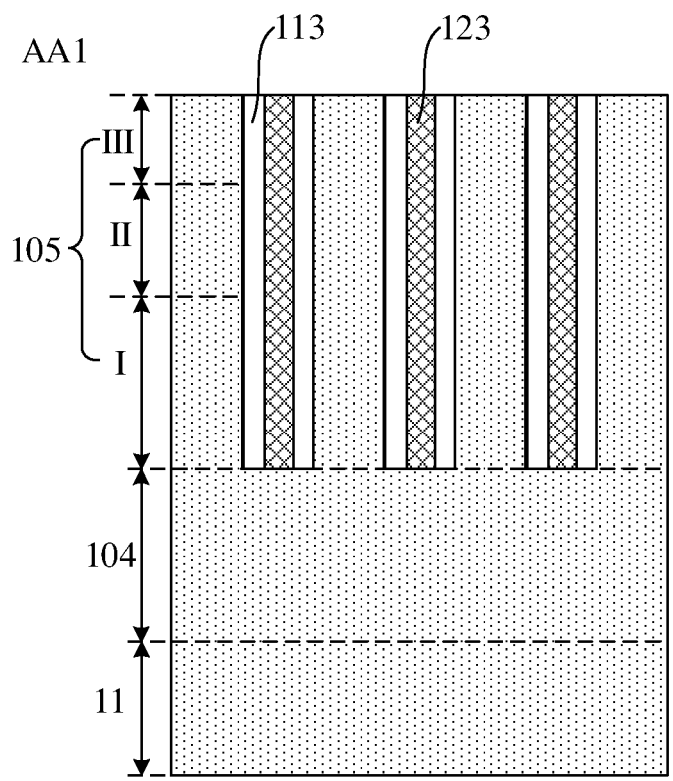

With reference to FIG. 7 and FIG. 9, the second dielectric layer 123 is formed to fill up the first gaps e. The second dielectric layer 123 and the first dielectric layer 113 are made of different materials.

In some examples, the second dielectric layer 123 may be formed as: a second dielectric film covering the top surface of the protective layer 130 and filling up the first gaps e is formed through a deposition process. The second dielectric film, the protective layer 130, the buffer layer 120 and the first dielectric layer 113 (refer to FIG. 6) are subjected to a chemical-mechanical planarization process until the top surfaces of the second doped regions III are exposed. The remaining part of the second dielectric film forms the second dielectric layer 123. The second dielectric film includes silicon nitride.

With reference to FIG. 10 to FIG. 17, a part of the first dielectric layer 113 is etched to expose the sidewalls of the channel regions II.

Figure 10:
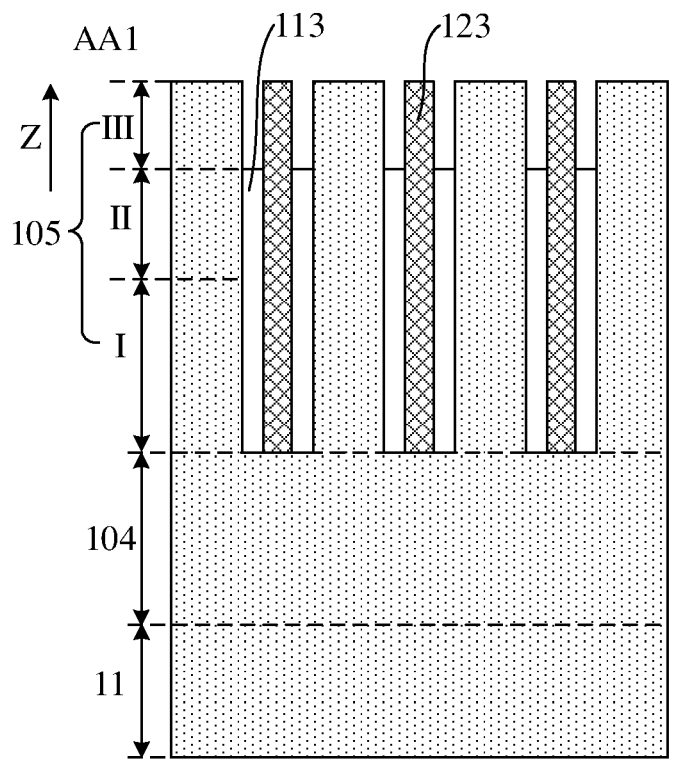

In some examples, the etching a part of the first dielectric layer 113 to expose the sidewalls of the channel regions II includes:

With reference to FIG. 9 and FIG. 10, a part of the first dielectric layer 113 is etched by using the semiconductor channels 105 and the second dielectric layer 123 as a mask to expose the sidewalls of the second doped regions III. In some examples, the second doped region III is 30 to 50 nm in a direction Z that is perpendicular to the bit line 104 and points to the semiconductor channel 105.

Figure 11:
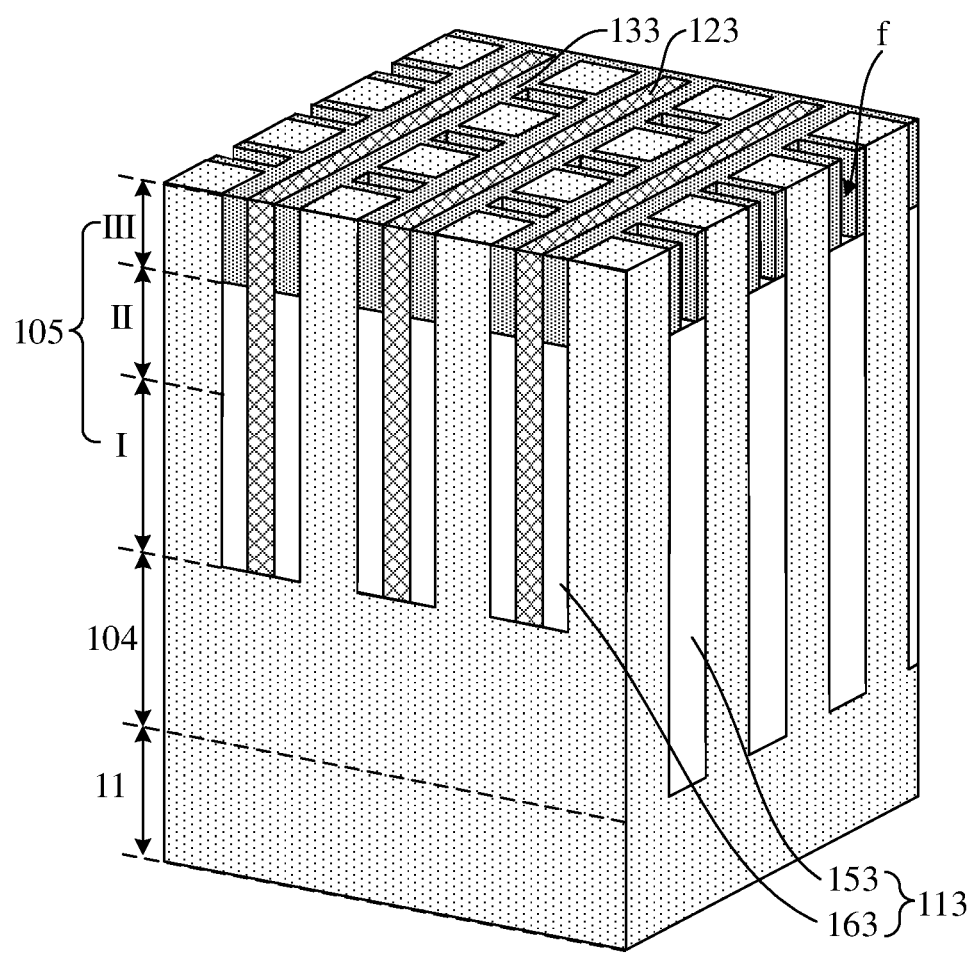
Figure 12:
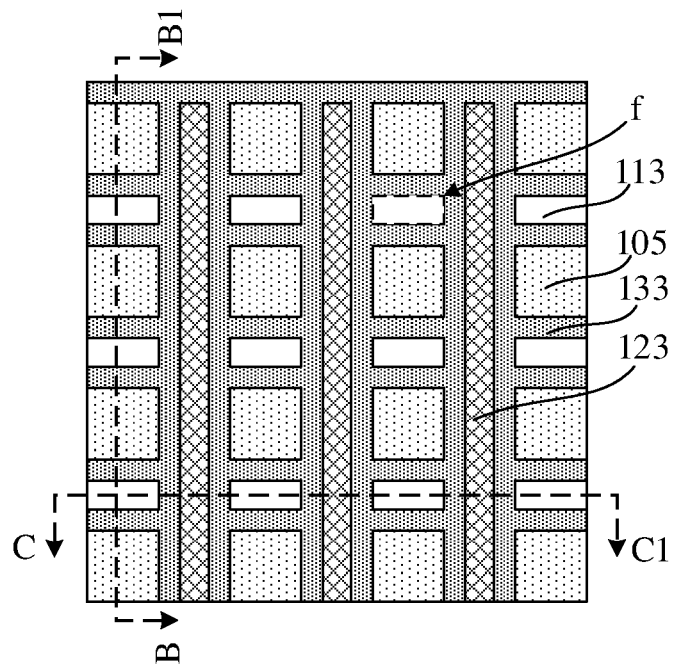
Figure 13:
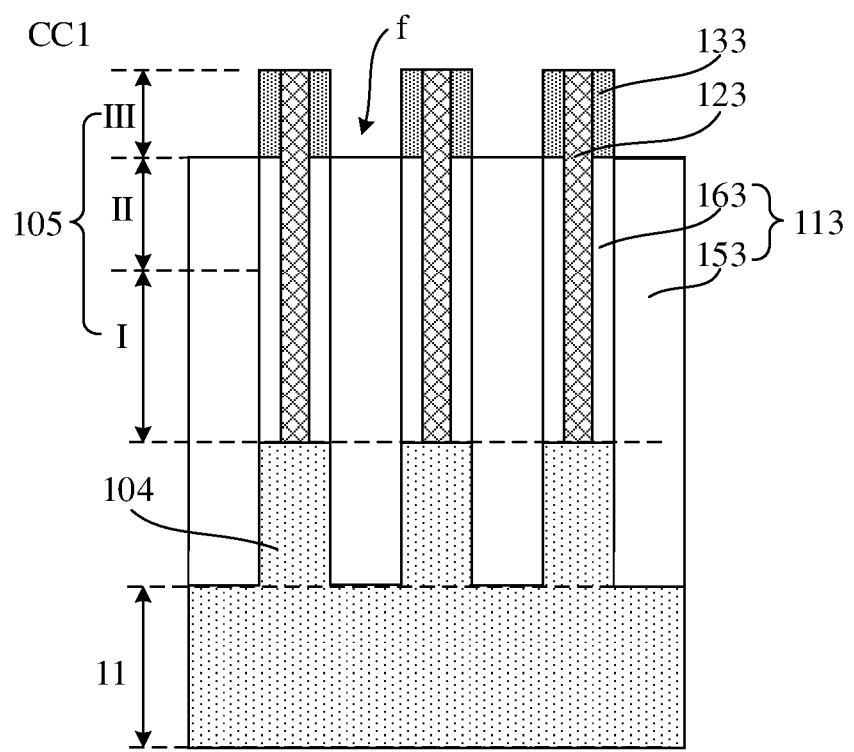
Figure 14:
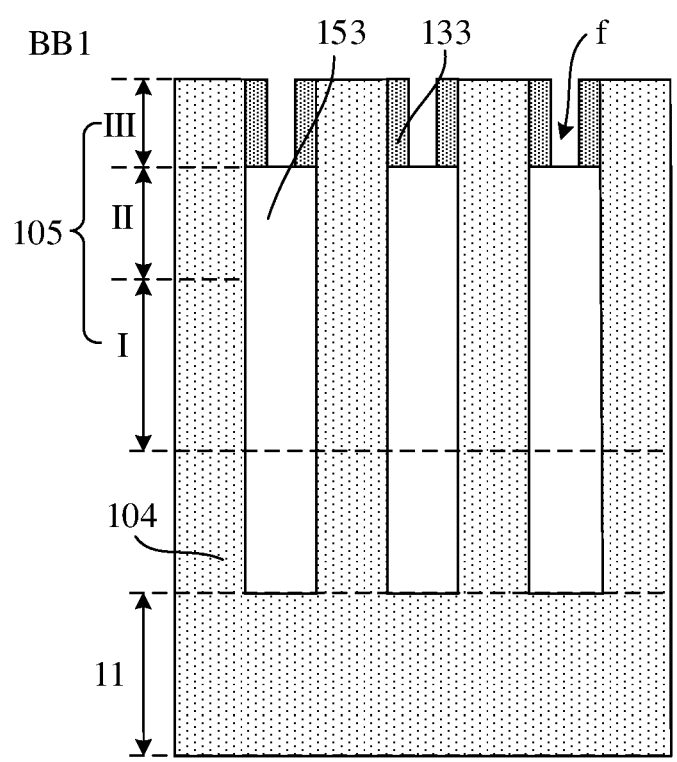

With reference to FIG. 11 to FIG. 14, FIG. 12 is a top view of FIG. 11. FIG. 13 is a sectional view taken along a third sectional direction CC1. FIG. 14 is a sectional view taken along a second sectional direction BB1.

A third dielectric layer 133 is formed. The third dielectric layer 133 surrounds the sidewalls of the second doped regions III and is located on the sidewall of the second dielectric layer 123. The part of the third dielectric layer 133 located on the sidewalls of the second doped regions III and the part of the third dielectric layer 133 located on the sidewall of the second dielectric layer 123 define through holes f. A part of the first dielectric layer 113 is exposed at the bottoms of the through holes f, and the third dielectric layer 133 and the first dielectric layer 113 are made of different materials.

With reference to FIG. 13 and FIG. 14, the third dielectric layer 133 covers the top surface of the sixth dielectric layer 163 and a part of the top surface of the fifth dielectric layer 153 while surrounding the sidewalls of the second doped regions III. The through holes f expose a part of the top surface of the fifth dielectric layer 153.

In this embodiment, the third dielectric layer 133 may be formed as: a third dielectric film is formed through a deposition process to conformally cover a surface formed by the semiconductor channels 105, the first dielectric layers 113, and the second dielectric layers 123. The third dielectric film is subjected to a maskless dry etching process until the top surfaces of the second doped regions III are exposed. In the same etching time, different regions of the third dielectric film are etched to have the same thickness to form the third dielectric layer 133 exposing a part of the first dielectric layer 113. The material of the third dielectric layer 133 includes silicon nitride.

In the first mask layer 102 and the second mask layer 112, a ratio of the width of the first opening b in the direction Y to that of the second opening c in the direction X is 2 to 1. When the third dielectric layer 133 is formed, the third dielectric layer 133 fills up the gaps between adjacent semiconductor channels 105 on the same bit line 104, but does not fill up the gaps between adjacent semiconductor channels 105 on adjacent bit lines 104. In this way, the formed through holes f can expose a part of the top surface of the fifth dielectric layer 153, which facilitates the subsequent removal of a part of the first dielectric layer 113 through the through holes f.

Figure 15:
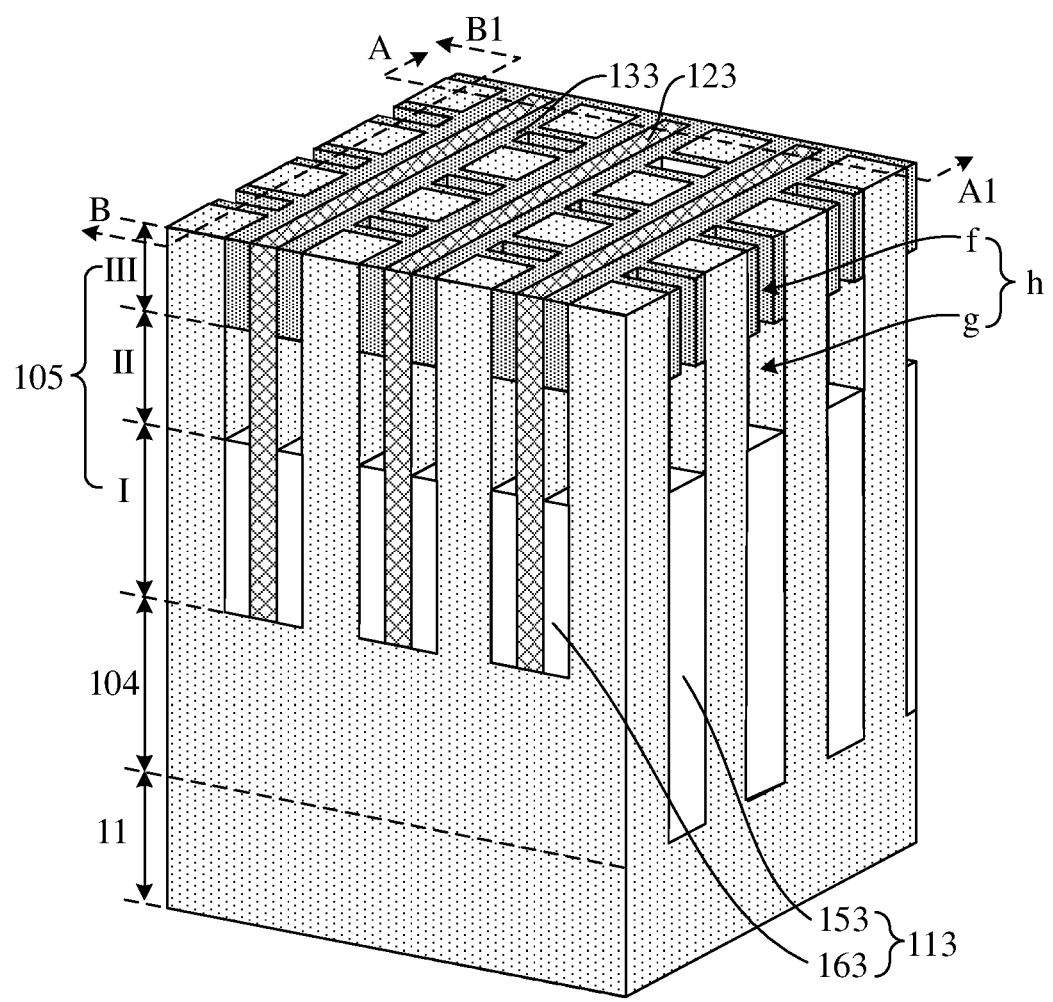
Figure 16:
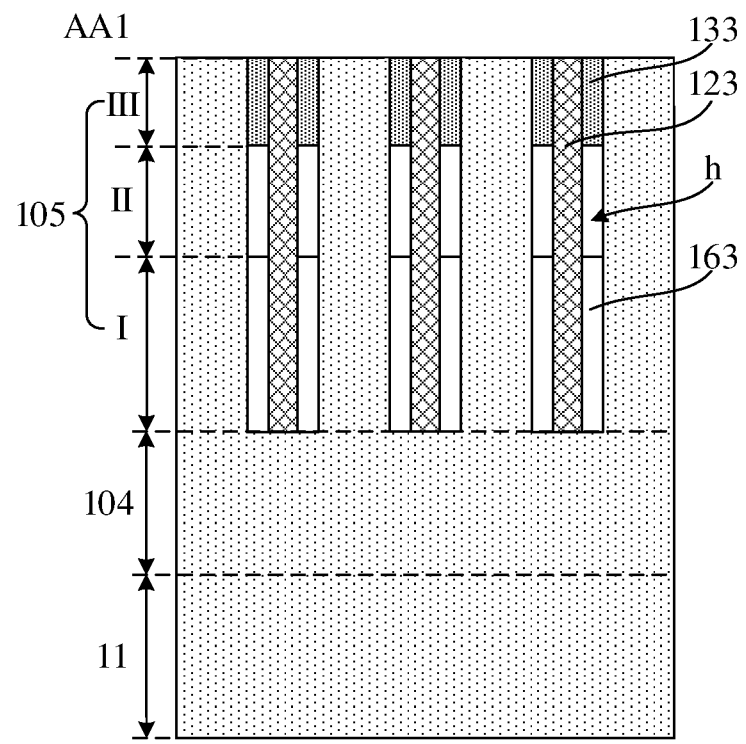
Figure 17:
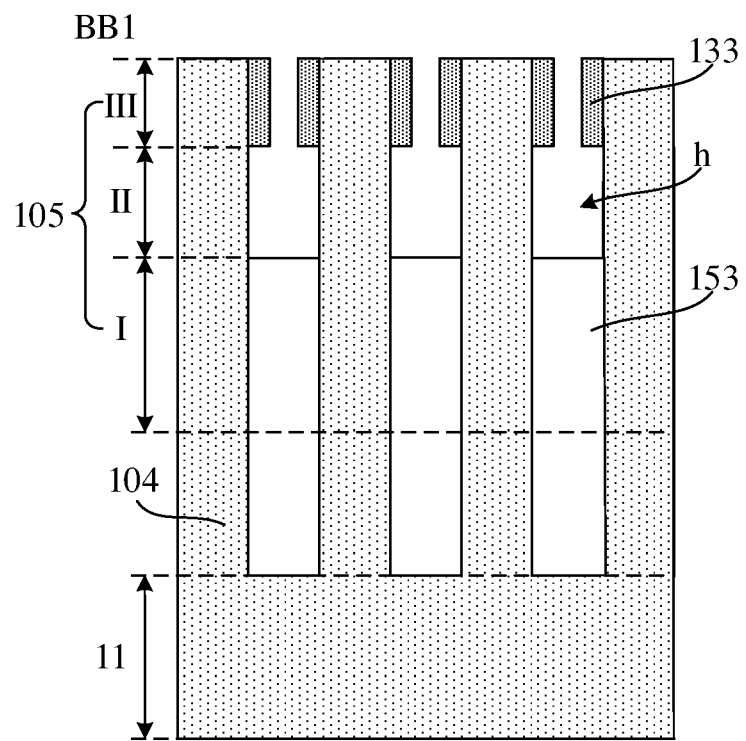

With reference to FIG. 15 to FIG. 17, the part of the first dielectric layer 113 located on the sidewalls of the channel regions II exposed by the through holes f is removed, and the remaining part of the first dielectric layer 113 surrounds the sidewalls of the first doped regions I.

The through holes f expose a part of the top surface of the first dielectric layer 113, and the first dielectric layer 113, the second dielectric layer 123 and the third dielectric layer 133 are made of mutually different materials. Therefore, an etching solution may be injected into the through holes f to etch the part of the first dielectric layer 113 located on the sidewalls of the channel regions II through a wet etching process. The part of the first dielectric layer 113 located on the sidewalls of the first doped regions I is retained.

The second dielectric layer 123 and the third dielectric layer 133 together form a support frame. The support frame is in contact with the second doped regions III, and the support frame is partially embedded in the first dielectric layer 113. In wet etching, the support frame supports and fixes the semiconductor channels 105. When the etching solution flows, a pressing force is generated on the semiconductor channel 105. The support frame prevents the semiconductor channels 105 from being pressed to be tilted or shifted, thereby improving the stability of the semiconductor structure. In addition, the support frame wraps the sidewalls of the second doped regions III to prevent the etching solution from damaging the second doped regions III.

After the part of the first dielectric layer 113 located on the sidewalls of the channel regions II is removed, third gaps g are formed between the channel regions II and the second dielectric layer 123, and the through hole f and the third gap g form a cave structure h.

Figure 18:
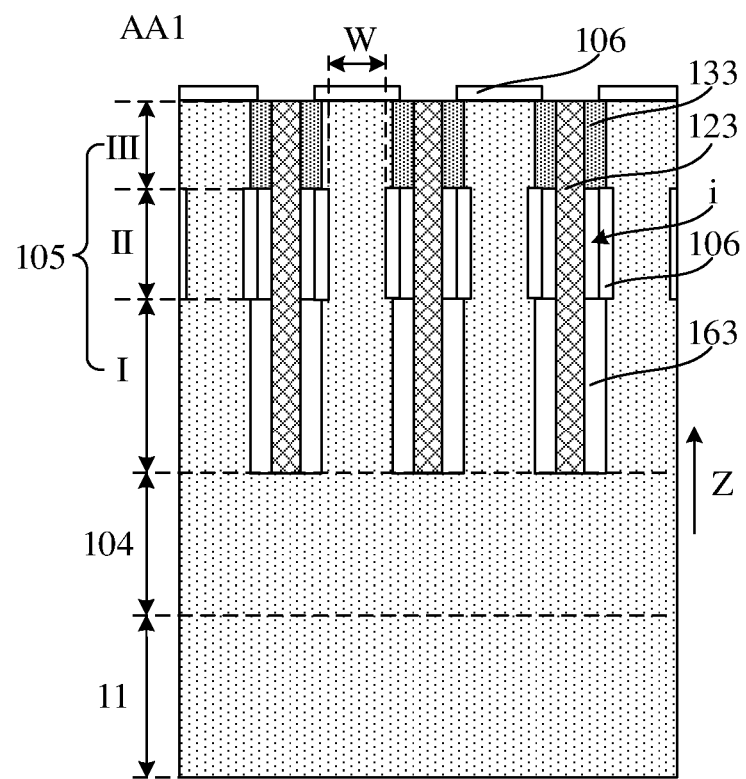
Figure 19:
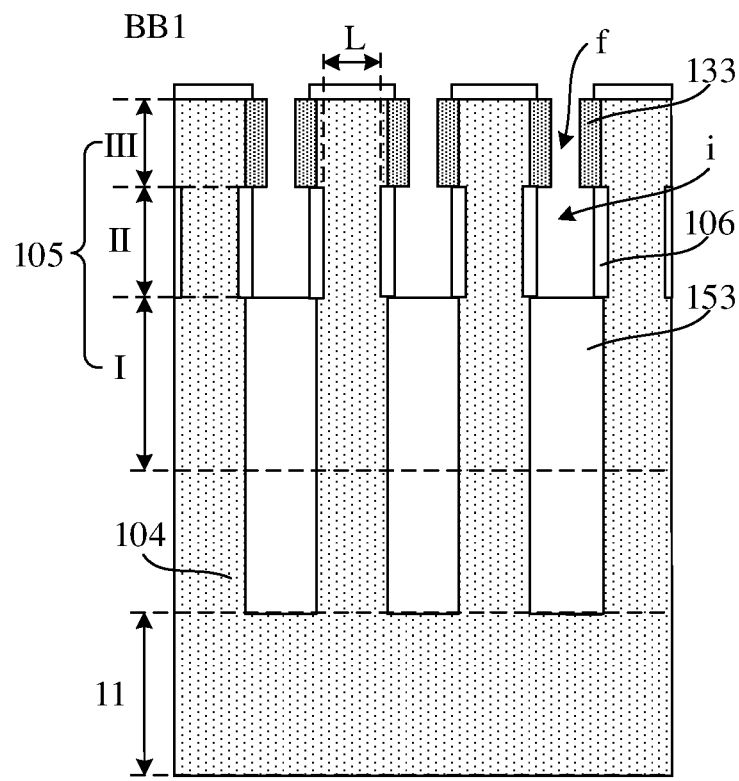

With reference to FIG. 18 and FIG. 19, an insulating layer 106 is formed. The insulating layer 106 covers at least sidewall surfaces of the channel regions II, and second gaps i are provided between the insulating layer 106 and the second dielectric layer 123. With reference to FIG. 19, the second gaps i are further located between parts of the insulating layer 106 on the sidewalls of adjacent semiconductor channels 105 of adjacent bit lines 104.

In this embodiment, because the semiconductor channels 105 are made of silicon, the forming the insulating layer 106 includes: the exposed sidewalls of the channel regions II are thermally oxidated to form the insulating layer 106. The insulating layer 106 covers the sidewall surfaces of the remaining part of the channel regions II. The insulating layer 106 is made of silicon oxide. In other embodiments, the insulating layer covering the sidewall surfaces of the channel regions may also be formed through the deposition process.

By thermally oxidizing the exposed sidewalls of the channel regions II, a part of the channel regions II is converted into the insulating layer 106. The orthographic projection of the channel region II on the bit line 104 is smaller than those of the second doped region III and the first doped region I on the bit line 104. Thus, the channel region II can be formed with a smaller sectional area in sections perpendicular to the direction Z from the bit line 104 to the semiconductor channel 105, without using an etching process. In this way, subsequently formed word lines can better control the channel regions II, such that the GAA transistors are better controlled to switch on or off.

In some examples, the width W and length L of the channel region II in the section perpendicular to the direction Z are not greater than 10 nm, which ensures that the subsequently formed word line well controls the channel region II. The height of the channel region II is 30 to 50 nm in the direction z.

Because the top surfaces of the second doped regions III are exposed outside, during the thermal oxidation, a part of the regions of the second doped regions II close to the top surfaces is converted into the insulating layer 106. In this embodiment, a part of the insulating layer 106 on the top surfaces of the remaining part of the second doped regions III is removed in a subsequent process step. In other embodiments, a part of the insulating layer on the top surfaces of the remaining part of the second doped regions may be removed after the thermal oxidation, and only a part of the insulating layer covering the sidewall surfaces of the remaining part of the channel regions is retained.

With reference to FIGS. 18 and 19, an orthographic projection of a periphery of the insulating layer 106 on the bit lines 104 is smaller than that of a periphery of the third dielectric layer 133 on the bit lines 104. That is, compared to an outer wall of the third dielectric layer 133 away from the semiconductor channel 105, an outer wall of the insulating layer 106 away from the semiconductor channel 105 is closer to the semiconductor channel 105. In this way, the second gaps i can be formed between the insulating layer 106 and the second dielectric layer 123, such that the subsequently formed word line can surround a part of the insulating layer 106 located on the sidewall of the channel region II. Compared to an outer wall of the first dielectric layer 113 (as shown in FIG. 15) away from the semiconductor channel 105, the outer wall of the insulating layer 106 away from the semiconductor channel 105 is also closer to the semiconductor channel 105.

Figure 20:
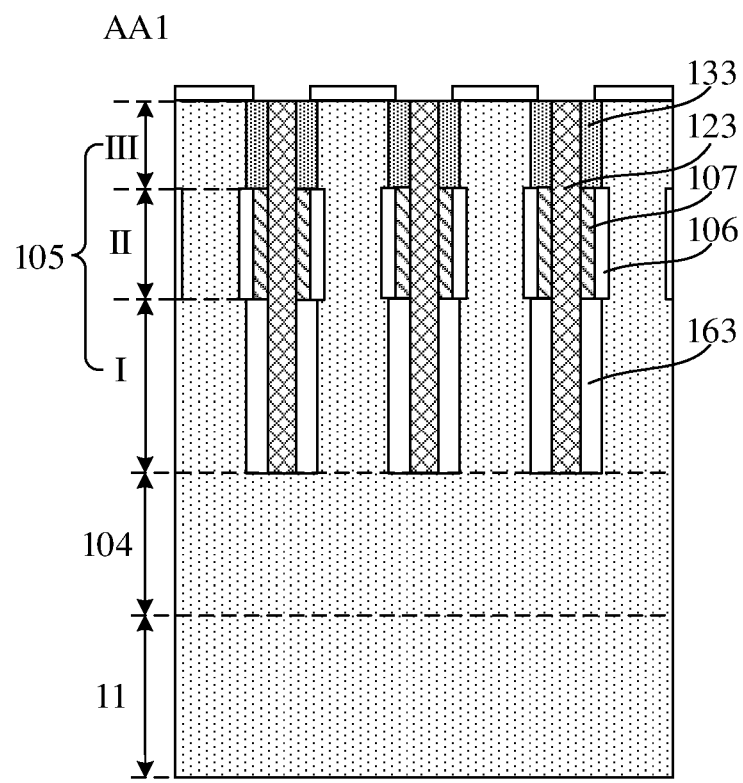
Figure 21:
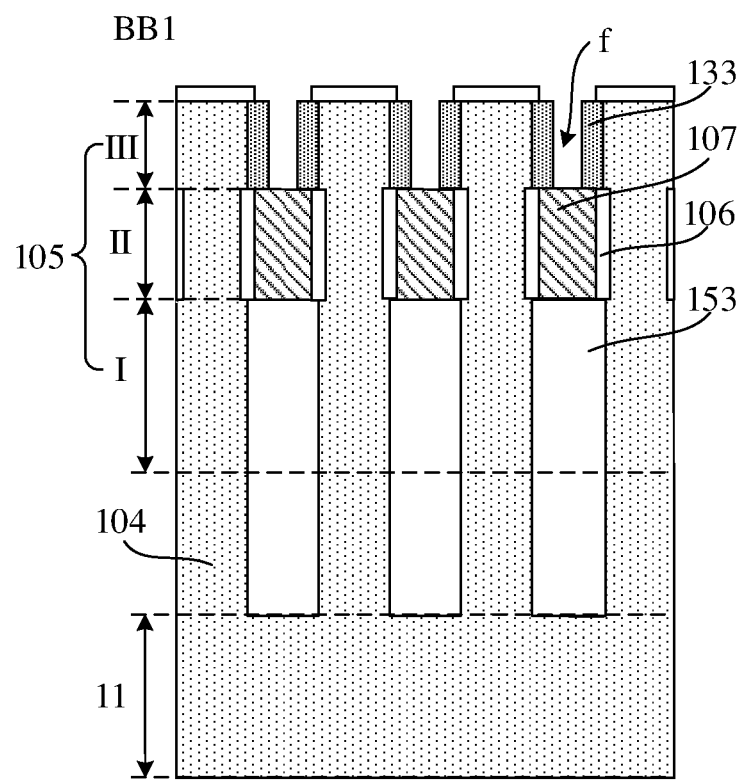
Figure 22:
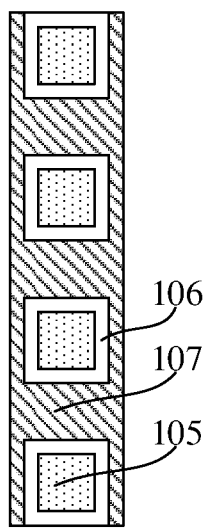

With reference to FIG. 20 to FIG. 22, FIG. 22 is a partial cross-sectional view in which one word line 107 in FIG. 21 surrounds four semiconductor channels 105.

The word lines 107 are formed and fill up the second gaps i.

In this embodiment, the forming the word lines 107 includes: initial word lines are formed and fill up the second gaps i and the through holes f. The initial word lines are located between the insulating layer 106 and the second dielectric layer 123 and between parts of the insulating layer 106 on the sidewalls of adjacent channel regions II on adjacent bit lines 104. The part of the initial word lines located in the through holes f is removed, and the remaining part of the initial word lines forms the word lines 107. The initial word lines may be formed through the deposition process. The material of the initial word line includes at least one of polysilicon, titanium nitride, tantalum nitride, copper or tungsten.

The initial word lines fill up the cave structures h (refer to FIG. 15) in self-aligned manner. After a part of the initial word lines located in the through holes f is removed, the word lines 107 can be formed with an accurate size in a self-aligned manner. There is no need to design the size of the word line 107 through an etching process, which simplifies the fabrication of the word lines 107. In addition, the adjusting the size of the second gap i obtains the small-sized word line 107.

Figure 23:
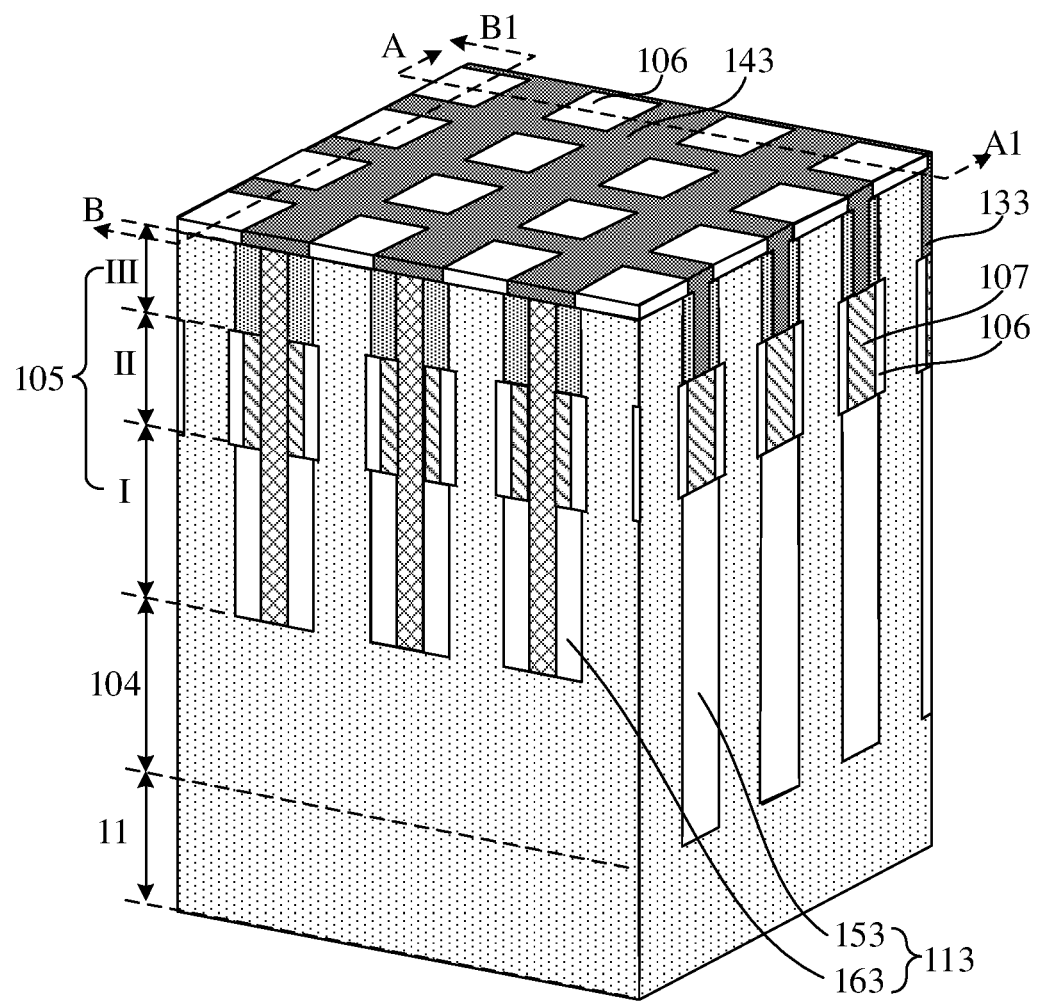

With reference to FIG. 23, after the word lines 107 are formed, a fourth dielectric layer 143 is also formed and fills up the through holes f (refer to FIG. 21).

In this embodiment, the fourth dielectric layer 143 may be formed as: a fourth dielectric film covering the top surface of a part of the insulating layer 106 located on the top surfaces of the second doped regions III and filling up the through holes f is formed through a deposition process. The fourth dielectric film is subjected to a chemical-mechanical planarization process until the top surface of the insulating layer 106 is exposed, and the remaining part of the fourth dielectric film forms the fourth dielectric layer 143. The fourth dielectric layer, the second dielectric layer, and the third dielectric layer are made of the same material that includes silicon nitride. In other embodiments, the fourth dielectric film may also be subjected to the chemical-mechanical planarization process to expose the top surfaces of the second doped regions. That is, a part of the insulating layer located on the top surfaces of the second doped regions is simultaneously removed, and the remaining part of the fourth dielectric film forms the fourth dielectric layer.

Figure 24:
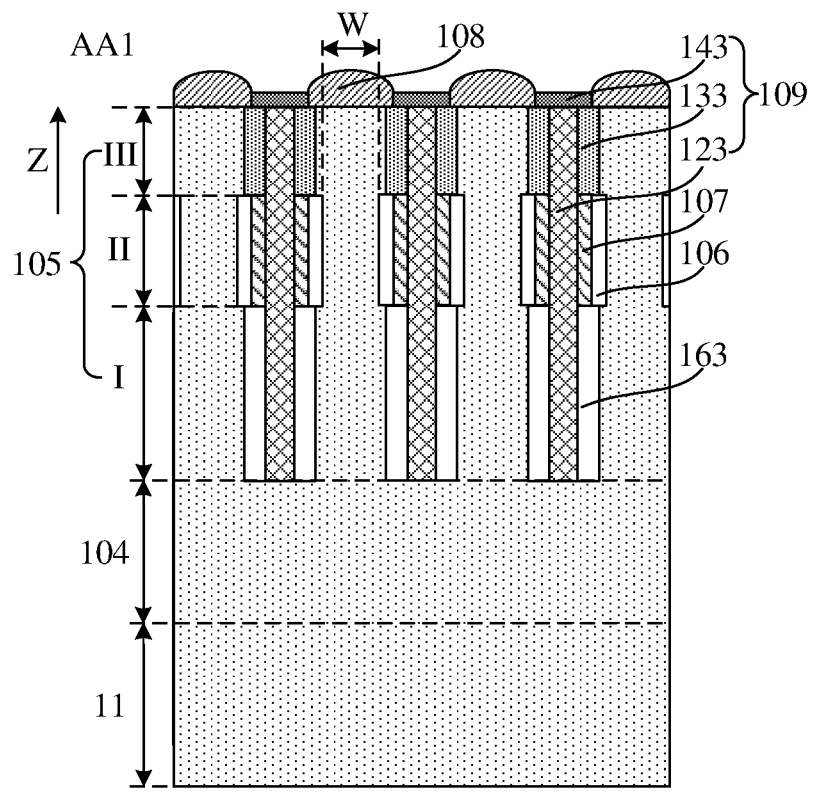
Figure 25:
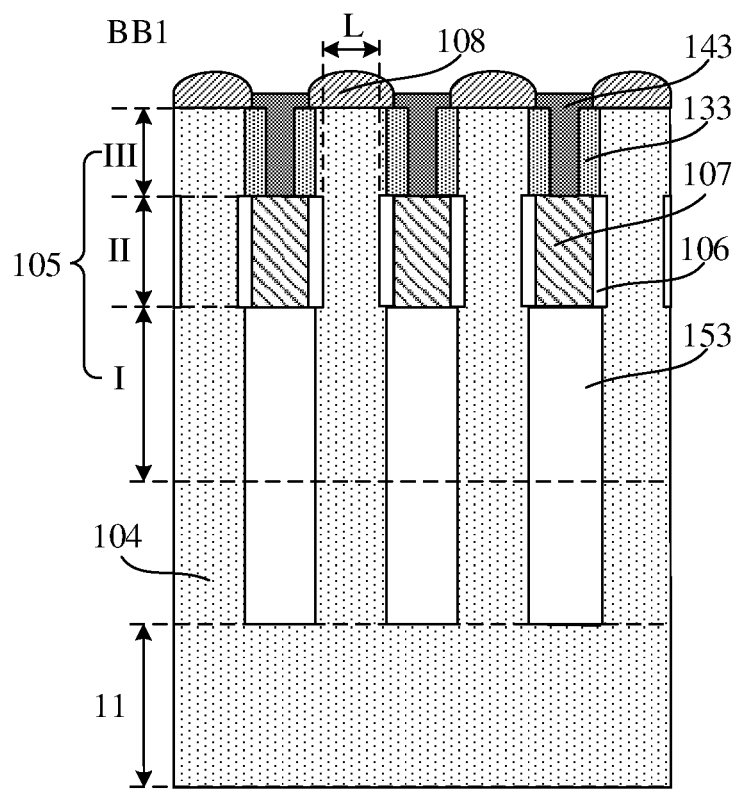

With reference to FIG. 23 to FIG. 25, a part of the insulating layer 106 located on the top surfaces of the second doped regions III is removed. A capacitor contact layer 108 is formed on the top surfaces of the second doped regions III through an epitaxial growth process. An orthographic projection of the capacitor contact layer 108 on the bit lines 104 covers those of the second doped regions III on the bit lines 104.

The epitaxial growth process improves the continuity between the second doped regions III and the capacitor contact layer 108. It reduces contact defects caused by different lattice characteristics or lattice dislocations, reduces contact resistance caused by the contact defects, and improves the transport capacity and moving speed of carriers. Thus, the conductivity between the second doped regions III and the capacitor contact layer 108 is improved, and the heat generated during the operation of the semiconductor structure is reduced. In addition, the epitaxial growth process increases the orthographic projection of the capacitor contact layer 108 on the bit lines 104, such that when a bottom electrode of the capacitor structure is formed on the capacitor contact layer 108, it is beneficial to increase the contact area between the capacitor contact layer 108 and the bottom electrode, thereby reducing the contact resistance between the capacitor contact layer 108 and the bottom electrode.

During the epitaxial growth, the capacitor contact layer 108 is further doped with the same type of doped ion as in the second doped region III. The doping concentration of the doped ion in the capacitor contact layer 108 is greater than that in the second doped region III, and therefore the resistance of the capacitor contact layer 108 is less than that of the second doped region III, thereby further decreasing the transfer resistance between the second doped region III and the bottom electrode.

Capacitor structures (not shown in the figure) are formed on a surface formed by the capacitor contact layer 108 and the fourth dielectric layer 143.

In other embodiments, after the word lines are formed, the second dielectric layer and the third dielectric layer may be removed through the wet etching process to form fourth gaps exposing the bit lines and all the top surface of the first dielectric layer. A seventh dielectric layer filling up the fourth gaps is formed through the deposition process. Because the seventh dielectric layer is integrated, the seventh dielectric layer has higher density and fewer internal defects, which is conducive to enhancing the isolation effect of the seventh dielectric layer on adjacent semiconductor channels and adjacent bit lines. In some examples, the seventh dielectric layer and the second dielectric layer may be made of the same material such as silicon nitride.

In other embodiments, the capacitor contact layer may not be formed. After a part of the insulating layer located on the top surfaces of the second doped regions is removed, the capacitor structure is directly formed on the top surface of the second doped region.

In summary, the first dielectric layer 113 and the second dielectric layer 123 are formed, and the first dielectric layer 113 is etched by using the second dielectric layer 123 as a mask to form cave structures h. The word lines 107 are formed with an accurate size in the cave structures in a self-aligned manner through a deposition process. There is no need to design the size of the word line 107 through an etching process, thereby simplifying the forming the word lines 107. In addition, by adjusting the size of the second gap i, the small-sized word line 107 can be obtained.

The present disclosure further provides a method of manufacturing a semiconductor structure, which is substantially the same as that in the previous embodiment, and the main difference lies in the different process of removing a part of the first dielectric layer to expose the sidewalls of the channel regions. The method of manufacturing a semiconductor structure provided by another embodiment of the present disclosure is described in detail below with reference to the accompanying drawings. The parts the same as or corresponding to those mentioned in the previous embodiment may be referred to the previous embodiment.

FIGS. 26 to 31 are schematic structural diagrams corresponding to steps of a method of manufacturing a semiconductor structure according to another embodiment of the present disclosure. It should be noted that to facilitate the description and clearly illustrate the steps of the method of manufacturing the semiconductor structure, FIGS. 26 to 31 in this embodiment are all partial schematic structural diagrams of the semiconductor structure. One or both of the sectional view of the structure along the first sectional direction AA1 or the sectional view of the structure along the second sectional direction BB1 are set later according to the requirements of the description. When referring to only one accompanying drawing, it is the sectional view along the first sectional direction BB1. When referring to two accompanying drawings at the same time, the first accompanying drawing is the sectional view along the second sectional direction AA1, and the second accompanying drawing is the sectional view along the second sectional direction BB1.

Figure 26:
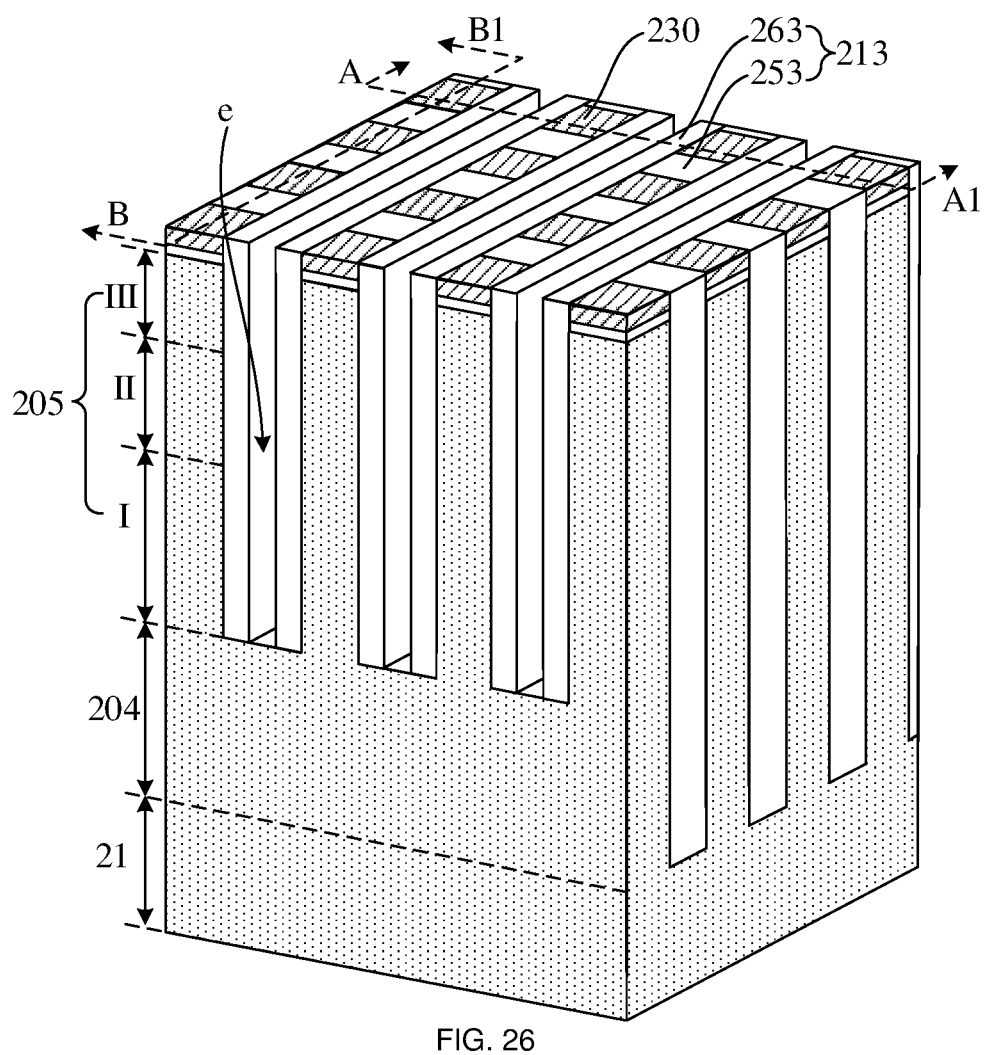
FIGS. 26 to 31 are schematic structural diagrams corresponding to steps of a method of manufacturing a semiconductor structure according to another embodiment of the present disclosure.
Figure 27:
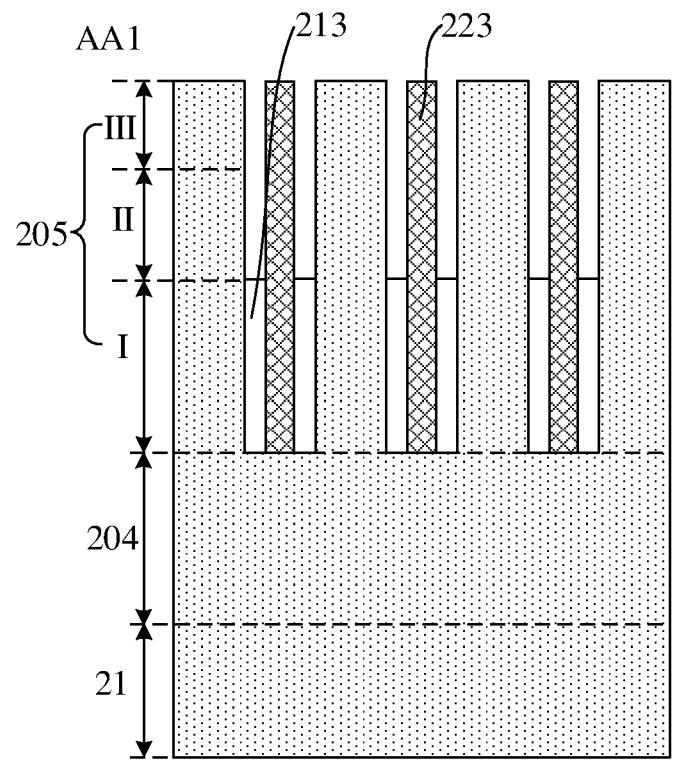

In this embodiment, with reference to FIG. 26 and FIG. 27, bit lines 204, semiconductor channels 205, a first dielectric layer 213 and a second dielectric layer 223 are formed on the base. A semiconductor well layer 21 is disposed in the base. The first dielectric layer 213 includes a fifth dielectric layer 253 and a sixth dielectric layer 263. The forming the bit lines 204, the semiconductor channels 205, the first dielectric layer 213 and the second dielectric layer 223 are the same as those in the foregoing embodiments. This is not described herein again.

With reference to FIG. 27, when a part of the first dielectric layer 213 is removed to expose the sidewalls of the channel regions II, a part of the first dielectric layer 213 located on the sidewalls of the second doped regions III is also removed, that is, the remaining part of the first dielectric layer 213 is only located on the sidewall surfaces of the first doped regions I.

Figure 28:
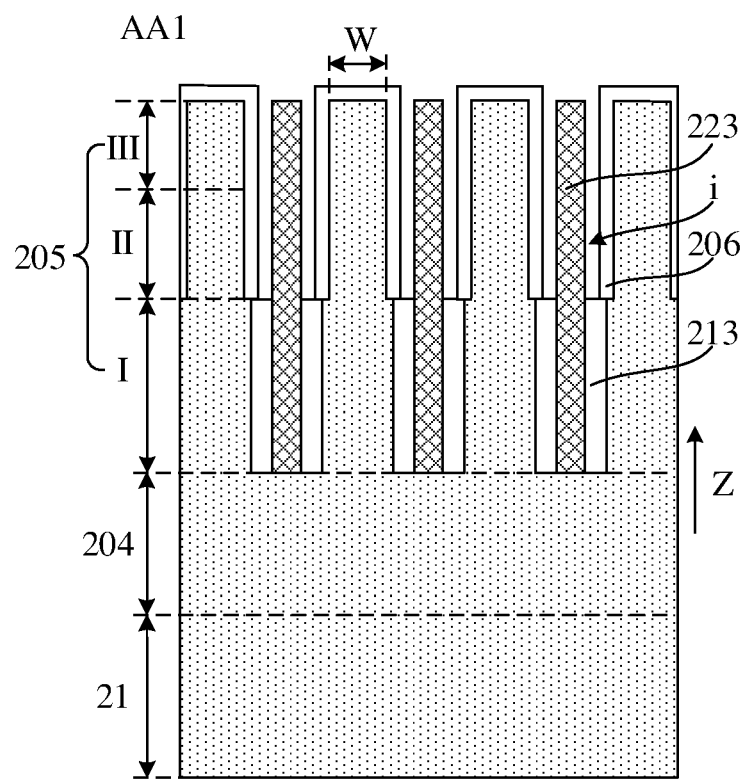
Figure 29:
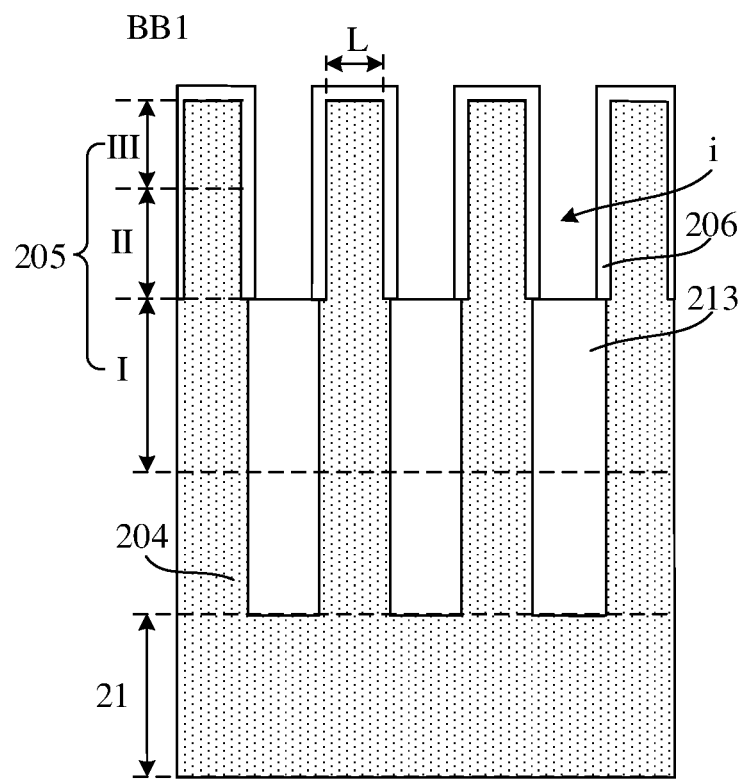

With reference to FIG. 28 and FIG. 29, an insulating layer 206 is formed. The insulating layer 206 not only covers the sidewall surfaces of the channel regions II, but also is located on the sidewall surfaces and the top surfaces of the second doped regions III. Second gaps i are provided between the insulating layer 206 and the second dielectric layer 223.

In this embodiment, the semiconductor channel 205 is made of silicon, and the insulating layer 206 is formed as: the exposed sidewalls of the channel regions II and the exposed sidewalls and top surfaces of the second doped regions III are thermally oxidized, to form the insulating layer 206, which cover the sidewall surfaces of the remaining part of the channel regions II and the remaining part of the second doped regions III. In other embodiments, the insulating layer covering the sidewalls of the channel regions and the sidewalls and top surfaces of the second doped regions may also be formed through a deposition process.

By thermally oxidizing the exposed sidewalls of the channel regions II and the second doped regions III, a part of the channel regions II and a part of the second doped regions III are converted into the insulating layer 206. The orthographic projections of the channel region II and the second doped region III on the bit line 204 is smaller than that of the first doped region I on the bit line 204. Thus, the channel region II and the second doped region III can be formed with smaller sectional areas in sections perpendicular to the direction Z from the bit line 204 to the semiconductor channel 205, without the etching process. In this way, it is beneficial to reduce the threshold voltage of the transistor formed by the semiconductor channel 205, such that the transistor can be turned on or off at a lower threshold voltage.

In some examples, the width W and length of the channel region II in the section perpendicular to the direction Z are not greater than 10 nm, which ensures that transistors have smaller threshold voltages. The height of the channel region II is 30 to 50 nm in the direction z.

In this embodiment, a part of the insulating layer 206 on the top surfaces of the remaining part of the second doped regions III is removed in a subsequent process. In other embodiments, a part of the insulating layer on the top surfaces of the remaining part of the second doped regions may be removed after the thermal oxidation, and only a part of the insulating layer covering the sidewall surfaces of the remaining part of the channel regions and the remaining part of the second doped regions is retained.

Figure 30:
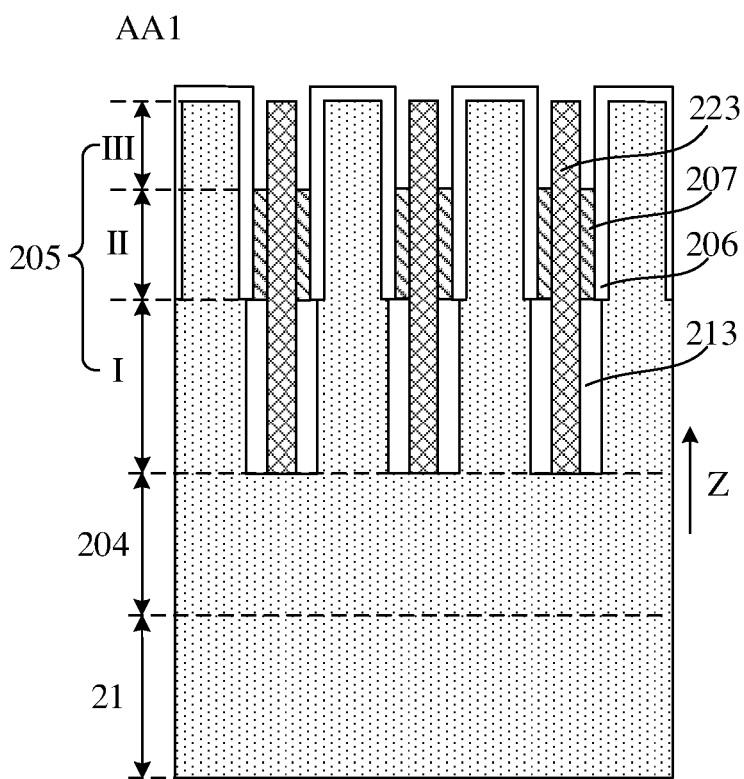
Figure 31:
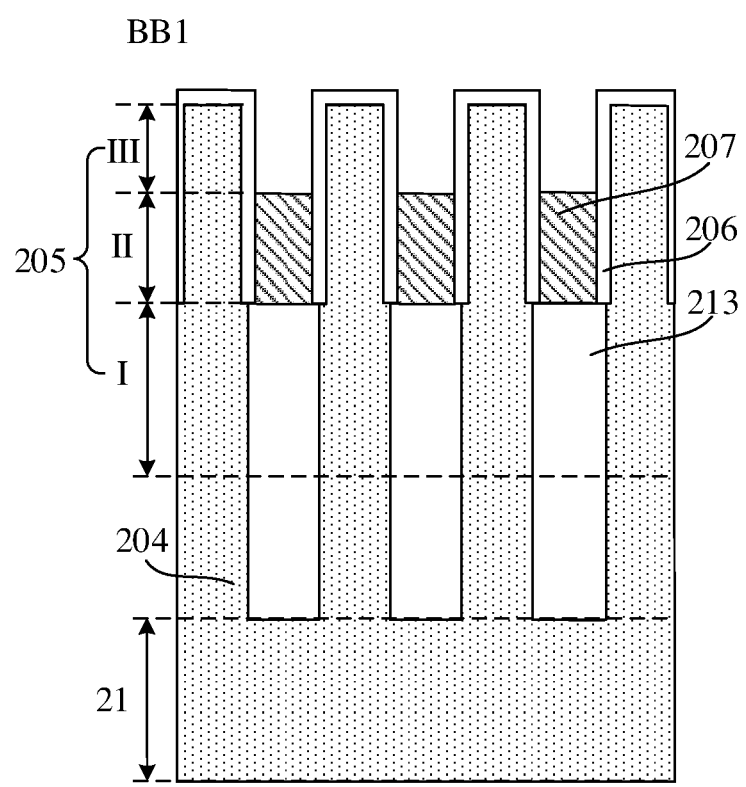

With reference to FIG. 30 and FIG. 31, word lines 207 are formed. The word lines 207 are formed as:

Initial word lines are formed and fill up second gaps i (refer to FIG. 29), that is, the initial word lines are located between parts of the insulating layer 206 covering sidewalls of channel regions II and the second doped regions III on adjacent initial bit lines 204. The initial word lines may be formed through a deposition process.

A part of the initial word lines is removed, and the remaining part of the initial word lines is used as the word lines 207, which surround only a part of the insulating layer 206 located on the sidewalls of the channel regions II.

The initial word lines fill up the second gaps i in self-aligned manner, such that the word lines 207 can be formed subsequently with an accurate size in a self-aligned manner. There is no need to design the size of the word line 207 through an etching process, which simplifies the fabrication of the word lines 207. In addition, adjusting the size of the second gap i can obtain the small-sized word line 207.

A fourth dielectric layer is formed and fills up gaps between parts of the insulating layer 206 located on sidewalls of the second doped regions III. Then, the part of the insulating layer 206 located on the top surfaces of the second doped regions III is removed. The forming the fourth dielectric layer and the removing the part of the insulating layer 206 are the same as those in the foregoing embodiments. In other embodiments, before the fourth dielectric layer is formed, the part of the insulating layer located on the sidewalls and the top surfaces of the second doped regions may also be removed, to form the fourth dielectric layer exposing the top surfaces of the first doped regions.

In this embodiment, a capacitor contact layer and capacitor contact structures may be also formed on the top surfaces of the second doped regions III in the same steps of the foregoing embodiments.

In summary, the first dielectric layer 213 and the second dielectric layer 223 is formed, and the first dielectric layer 213 is etched by using the second dielectric layer 223 as a mask to form second gaps i. The word lines 207 are formed with an accurate size in the second gaps i in a self-aligned manner through a deposition process. There is no need to design the size of the word line 207 through an etching process, thereby simplifying the forming the word lines 207. In addition, adjusting the size of the second gap i can obtain the small-sized word line 207.

The present disclosure further provides a semiconductor structure, which is made by using the method of manufacturing a semiconductor structure according to any one of the foregoing embodiments.

With reference to FIG. 24 and FIG. 25, the semiconductor structure includes: a base, wherein the base includes a semiconductor well layer 11; bit lines 104, located on the semiconductor well layer 11; semiconductor channels 105, located on surfaces of the bit lines 104, wherein the semiconductor channel 105 includes a first doped region I, a channel region II, and a second doped region III arranged sequentially along a direction Z that the base points to the bit line 104, and the first doped region I is in contact with the bit line 104.

In this embodiment, the base, the bit line 104 and the semiconductor channel 105 have the same semiconductor element, and therefore the semiconductor channels 105 and the bit lines 104 are formed using the same film structure. The film structure is formed by the semiconductor element, such that the semiconductor channels 105 and the bit lines 104 are integrated, thereby avoiding an interface state defect between the semiconductor channels 105 and the bit lines 104 and improving the performance of the semiconductor structure.

The semiconductor element may include at least one of silicon, carbon, germanium, arsenic, gallium or indium. The base, the bit line 104, and the semiconductor channel 105 may be made of an elemental semiconductor material or a crystalline inorganic compound semiconductor material. The elemental semiconductor material may include silicon or germanium, and the crystalline inorganic compound semiconductor material may include silicon carbide, silicon germanium, gallium arsenide or indium gallium.

The first doped region I, the channel region II and the second doped region III are doped with the same type of doped ion, and the doping concentration of the doped ion in the first doped region I is consistent with those of the doped ion in the channel region II and in the second doped region III. In addition, because the device formed by the semiconductor channel 105 is a junctionless transistor, it avoids the use of an ultra-steep source/drain doping process to make an ultra-steep PN junction in a nanoscale range. Therefore, problems such as threshold voltage drift and leakage current increase caused by abrupt changes in the doping concentration can be avoided, and the short channel effect can be easily suppressed, such that the device can still operate in the range of a few nanometers. Such a design further improves the integration density and electrical performance of the semiconductor structure. The doped ion is one of the N-type ion and the P-type ion.

An orthographic projection of the channel region II on the bit line 104 is smaller than that of the second doped region III on the bit line 104 and that of the first doped region I on the bit line 104. The channel region II can be formed with a smaller sectional area without using the etching process in a section perpendicular to the direction Z from the bit line 104 to the semiconductor channel 105. In this way, the word line 107 can better control the channel region II, thereby facilitating the control of the on or off of the GAA transistor.

In some examples, the width W and length L of the channel region II in the section perpendicular to the direction Z are not greater than 10 nm, which ensures that transistors have smaller threshold voltages. The height of the channel region II is 30 to 50 nm in the direction z.

With reference to FIG. 6 and FIG. 24 to FIG. 25, the semiconductor structure further includes a first dielectric layer 113, surrounding the first doped regions I. A first gap is provided between parts of the first dielectric layer 113 covering sidewalls of adjacent first doped regions I on the same bit line 104.

The first dielectric layer 113 may include a fifth dielectric layer 153 and a sixth dielectric layer 163. The fifth dielectric layer 153 is located in gaps between adjacent bit lines 104 and is also located in gaps between adjacent first doped regions I on adjacent bit lines 104. The sixth dielectric layer 163 is located on sidewalls of adjacent first doped regions I on the same bit line 104, and is also located on a sidewall of fifth dielectric layer 153. The first dielectric layer 113 is used to achieve electrical insulation between adjacent semiconductor channels 105 and adjacent bit lines 104.

The semiconductor structure further includes an insulating layer 106, which at least covers sidewall surfaces of the channel regions II. In this embodiment, the insulating layer 106 only covers sidewall surfaces of the channel regions II. In other embodiments, the insulating layer may cover sidewall surfaces of both of the channel regions and the second doped regions.

The semiconductor structure further includes word lines 107, surrounding the insulating layers 106 covering the sidewalls of the channel regions II, wherein a second gap is provided between adjacent word lines 107; an isolation layer 109, located at least in the first gaps and the second gaps, wherein a top surfaces of the isolation layer 109 away from the base is not lower than that of the second doped region III away from the base.

The isolation layers 109 may include a second dielectric layer 123 and a third dielectric layer 133. The second dielectric layer 123 is located in the first gaps and the second gaps. The top surface of the second dielectric layer 123 away from the base is not lower than that of the second doped region III away from the base. The third dielectric layer 133 covers the sidewalls of the second doped regions III.

In some examples, the top surface of the second dielectric layer 123 is flush with that of the second doped region III. The isolation layer 109 further includes a fourth dielectric layer 143. With reference to FIG. 25, the fourth dielectric layer 143 is located on a top surface formed by the second dielectric layer 123 and the third dielectric layer 133, and is located in gaps between adjacent parts of the third dielectric layer 133. The second dielectric layer 123, the third dielectric layer 133, and the fourth dielectric layer 143 are made of the same material and form the isolation layer 109, to achieve electrical insulation between adjacent semiconductor channels 105 and adjacent bit lines 104. In other embodiments, the second dielectric layer, the third dielectric layer, and the fourth dielectric layer are integrated, such that the isolation layer has a relatively high density and fewer internal defects, which is conducive to enhancing the isolation effect of the isolation layer on adjacent semiconductor channels and adjacent bit lines.

In some other embodiments, when covering the sidewall surfaces of both of the channel regions and the second doped regions, the isolation layer includes one of the second dielectric layer and one of the fourth dielectric layer. The second dielectric layer is located in the first gaps and the second gaps. The top surface of the second dielectric layer away from the base is not lower than that of the second doped region away from the base. The fourth dielectric layer is located in gaps formed by the second dielectric layer and the insulating layer and gaps formed by adjacent parts of the isolation layer, and the fourth dielectric layer covers a top surface of the second dielectric layer.

An orthographic projection of a periphery of the insulating layer 106 on the bit lines 104 is smaller than that of a periphery of the third dielectric layer 133 on the bit lines 104.

The semiconductor structure may further include a capacitor contact layer 108, located on the top surfaces of the second doped regions III. The orthographic projection of the capacitor contact layer 108 on the bit lines 104 cover those of the second doped regions III on the bit lines 104. The capacitor contact layer 108 is doped with doped ion of which the doping concentration is greater than that in the second doped region III.

Because the capacitor contact layer 108 and the second doped regions III are doped with the same type of doped ion, and the doping concentration of the doped ion in the capacitor contact layer 108 is greater than that in the second doped region III, the conductivity of the capacitor contact layer 108 can be further improved. The orthographic projection of the capacitor contact layer 108 on the bit lines 104 cover those of the second doped regions III on the bit lines 104, which is beneficial to increase the contact area between the capacitor contact layer 108 and other subsequent conductive structures, thereby reducing the contact resistance between the capacitor contact layer 108 and the other subsequent conductive structures.

The semiconductor structure may further include a capacitor structure (not shown in the figure), wherein the capacitor structure is located on a surface formed by the capacitor contact layer 108 and the fourth dielectric layer 143.

In summary, in a section perpendicular to the direction Z from the bit line 104 to the semiconductor channel 105, the cross-sectional area of the channel region II is smaller than those of the first doped region I and the second doped region II, which is beneficial to reduce the threshold voltage of the transistor formed by the semiconductor channel 105, such that the transistor is turned on or off at a lower threshold voltage. The device formed by the semiconductor channel 105 is a junctionless transistor, which avoids the use of an ultra-steep source/drain doping process. Therefore, problems such as threshold voltage drift and leakage current increase caused by abrupt changes in the doping concentration can be avoided, and the short channel effect can be easily suppressed. Such a design further improves the integration density and electrical performance of the semiconductor structure.

It should be understood that the present disclosure does not limit its application to the detailed structure and arrangement of components set forth in this specification. The present disclosure can include other embodiments and can implement and execute them in a plurality of manners. The foregoing variations and modifications fall within the scope of the present disclosure. It may be understood that the present disclosure disclosed and defined in this specification extends to all alternative combinations of two or more of the individual features mentioned or evident in the text and/or accompanying drawings. All of these different combinations constitute a plurality of alternative aspects of the present disclosure. The implementations described in this specification illustrate the known optimal manner for implementing the present disclosure, and enables those skilled in the art to use the present disclosure.

INDUSTRIAL APPLICABILITY

Embodiments of the present disclosure provide a semiconductor structure and a manufacturing method thereof, which is beneficial to simplify the forming word lines, and form word lines with a small size and high accuracy.

The invention claimed is:

1. A method of manufacturing a semiconductor structure, comprising:
    providing a base;
    forming bit lines on the base, and forming semiconductor channels on surfaces of the bit lines away from the base, the semiconductor channel comprising a first doped region, a channel region and a second doped region sequentially arranged along a direction that the base points to the bit line;
    forming a first dielectric layer, the first dielectric layer surrounding sidewalls of the semiconductor channels, and a first gap being provided between parts of the first dielectric layer located on sidewalls of adjacent semiconductor channels on a same bit line;
    forming a second dielectric layer, the second dielectric layer filling up the first gaps, and a material of the second dielectric layer being different from a material of the first dielectric layer;
    removing a part of the first dielectric layer to expose sidewalls of the channel regions;
    forming an insulating layer, the insulating layer covering at least sidewall surfaces of the channel regions, and second gaps being provided between the insulating layer and the second dielectric layer; and
    forming word lines, the word lines filling up the second gaps.

2. The method of manufacturing a semiconductor structure according to claim 1, wherein the removing a part of the first dielectric layer to expose sidewalls of the channel regions comprises:
    etching a part of the first dielectric layer to expose sidewalls of the second doped regions;
    forming a third dielectric layer, the third dielectric layer surrounding the sidewalls of the second doped regions and being located on a part of a sidewall of the second dielectric layer, a part of the third dielectric layer located on the sidewalls of the second doped regions and a part of the third dielectric layer located on the part of the sidewall of the second dielectric layer defining through holes, a part of the first dielectric layer being exposed at bottoms of the through holes, and a material of the third dielectric layer being different from the material of the first dielectric layer; and
    removing a part of the first dielectric layer located on the sidewalls of the channel regions and exposed by the through holes, a remaining part of the first dielectric layer surrounding sidewalls of the first doped regions.

3. The method of manufacturing a semiconductor structure according to claim 2, wherein the forming an insulating layer comprises:
    thermally oxidizing the sidewalls of the channel regions exposed, to form the insulating layer, and the insulating layer covering sidewall surfaces of a remaining part of the channel regions.

4. The method of manufacturing a semiconductor structure according to claim 2, wherein the forming word lines comprises:
    forming initial word lines, the initial word lines filling up the second gaps and the through holes, and the initial word lines being also located between parts of the insulating layer covering sidewalls of channel regions on adjacent bit lines; and
    removing a part of the initial word lines located in the through holes, and a remaining part of the initial word lines being used as the word lines.

5. The method of manufacturing a semiconductor structure according to claim 4, after the forming word lines, further comprising: forming a fourth dielectric layer, the fourth dielectric layer filling up the through holes.

6. The method of manufacturing a semiconductor structure according to claim 1, wherein the removing a part of the first dielectric layer to expose sidewalls of the channel regions further comprises: removing a part of the first dielectric layer located on sidewalls of the second doped regions; and in the forming an insulating layer, the insulating layer further covers the sidewalls of the second doped regions.

7. The method of manufacturing a semiconductor structure according to claim 6, wherein the forming word lines comprises:
forming initial word lines, the initial word lines filling up the second gaps, and the initial word lines being also located between parts of the insulating layer covering a part of sidewalls of the semiconductor channels on adjacent bit lines; and
removing a part of the initial word lines, a remaining part of the initial word lines being used as the word lines, and the word lines surrounding only a part of the insulating layer located on the sidewalls of the channel regions.

8. The method of manufacturing a semiconductor structure according to claim 1, wherein the forming bit lines and the forming semiconductor channels comprise:
forming a first mask layer on the base;
etching the base by using the first mask layer as a mask, and forming a plurality of first trenches;
removing the first mask layer, and forming a fifth dielectric layer in the first trenches;
forming a second mask layer on a top surface formed by the fifth dielectric layer and a remaining part of the base;
etching the base and the fifth dielectric layer by using the second mask layer as a mask, and forming a plurality of second trenches, the bit lines, and the semiconductor channels, and a depth of the second trench being smaller than a depth of the first trench in a direction perpendicular to a surface of the base; and
removing the second mask layer.

9. The method of manufacturing a semiconductor structure according to claim 8, wherein the first mask layer comprises a plurality of first openings separated from each other, the second mask layer comprises a plurality of second openings separated from each other, and an extension direction of the first opening is perpendicular to an extension direction of the second opening.

10. The method of manufacturing a semiconductor structure according to claim 9, wherein in a direction perpendicular to the sidewall of the semiconductor channel, a ratio of a width of the first opening to a width of the second opening is 2 to 1, and a spacing between adjacent first openings is equal to a spacing between adjacent second openings.

11. The method of manufacturing a semiconductor structure according to claim 8, wherein the forming a first dielectric layer comprises:
forming a sixth dielectric layer, the sixth dielectric layer being located on sidewalls of the second trenches, a remaining part of the fifth dielectric layer and the sixth dielectric layer forming the first dielectric layer, and a part of the sixth dielectric layer located on the sidewall of the second trench being provided with the first gap.

12. The method of manufacturing a semiconductor structure according to claim 1, further comprising:
forming a capacitor contact layer on top surfaces of the second doped regions through an epitaxial growth process, and an orthographic projection of the capacitor contact layer on the bit lines covering orthographic projections of the second doped regions on the bit lines.

13. A semiconductor structure, comprising:
a base;
bit lines, located on the base;
semiconductor channels, located on surfaces of the bit lines, the semiconductor channel comprising a first doped region, a channel region and a second doped region sequentially arranged along a direction that the base points to the bit line, and the first doped region being in contact with the bit line;
a first dielectric layer, surrounding the first doped regions, and a first gap being provided between parts of the first dielectric layer covering sidewalls of adjacent first doped regions on a same bit line;
an insulating layer, covering at least sidewall surfaces of the channel regions;
word lines, surrounding the insulating layer located on sidewalls of the channel regions, and a second gap being provided between adjacent word lines; and
an isolation layer, located at least in the first gaps and the second gaps, and a top surface of the isolation layer away from the base being not lower than a top surface of the second doped region away from the base;
wherein the base, the bit line and the semiconductor channel comprise a same semiconductor element.

14. The semiconductor structure according to claim 13, wherein the first doped region, the channel region and the second doped region are doped with a same type of a doped ion, a doping concentration of the doped ion in the first doped region is the same as a doping concentration of the doped ion in the channel region and a doping concentration of the doped ion in the second doped region, and the doped ion is one of N-type ion or P-type ion.

15. The semiconductor structure according to claim 14, further comprising: a capacitor contact layer, located on the top surfaces of the second doped regions, an orthographic projection of the capacitor contact layer on the bit lines covering orthographic projections of the second doped regions on the bit lines, and the capacitor contact layer being doped with the doped ion, and a doping concentration of the doped ion in the capacitor contact layer being greater than the doping concentration of the doped ion in the second doped region.

16. The semiconductor structure according to claim 13, wherein an orthographic projection of the channel region on the bit line is smaller than an orthographic projection of the second doped region on the bit line, and is smaller than an orthographic projection of the first doped region on the bit line.

17. The semiconductor structure according to claim 13, wherein the isolation layer comprises a second dielectric layer and a third dielectric layer, the second dielectric layer is located in the first gaps and the second gaps, and a top surface of the second dielectric layer away from the base is not lower than the top surface of the second doped region away from the base; and the third dielectric layer covers sidewalls of the second doped regions.

18. The semiconductor structure according to claim 17, wherein an orthographic projection of a periphery of the insulating layer on the bit lines is smaller than an orthographic projection of a periphery of the third dielectric layer on the bit lines.

19. The semiconductor structure according to claim 13, wherein the first dielectric layer comprises a fifth dielectric layer and a sixth dielectric layer, the fifth dielectric layer is located in gaps between adjacent bit lines, and is located in gaps between adjacent first doped regions on adjacent bit lines; and the sixth dielectric layer is located on the sidewalls of the adjacent first doped regions on the same bit line, and is located on a sidewall of the fifth dielectric layer.

* * * * *